US008432689B2

(12) United States Patent
Coglitore et al.

(10) Patent No.: US 8,432,689 B2
(45) Date of Patent: Apr. 30, 2013

(54) RACK MOUNTED COMPUTER SYSTEM

(75) Inventors: Giovanni Coglitore, Saratoga, CA (US);
Matthew P. Casebolt, Fremont, CA (US)

(73) Assignee: Silicon Graphics International Corp., Fremont, CA (US)

( * ) Notice: Subject to any disclaimer, the term of this patent is extended or adjusted under 35 U.S.C. 154(b) by 0 days.

(21) Appl. No.: 13/028,169

(22) Filed: Feb. 15, 2011

(65) Prior Publication Data

US 2011/0133620 A1 Jun. 9, 2011

Related U.S. Application Data

(62) Division of application No. 12/407,744, filed on Mar. 19, 2009, now Pat. No. 7,911,785, which is a division of application No. 11/125,942, filed on May 9, 2005, now Pat. No. 7,529, 097.

(60) Provisional application No. 60/569,025, filed on May 7, 2004, provisional application No. 60/568,969, filed on May 7, 2004, provisional application No. 60/569,020, filed on May 7, 2004, provisional application No. 60/569, 019, filed on May 7, 2004.

(51) Int. Cl.
*H05K 5/00* (2006.01)
*A47B 95/00* (2006.01)
*F16M 11/00* (2006.01)

(52) U.S. Cl.
USPC ...... 361/679.58; 361/726; 361/727; 312/333; 312/334.46; 248/201

(58) Field of Classification Search ............. 361/678.58, 361/724–727; 312/333, 334.46; 211/191; 248/200, 201
See application file for complete search history.

(56) References Cited

U.S. PATENT DOCUMENTS

| | | |
|---|---|---|
| 5,202,536 A | 4/1993 | Buonanno |
| 5,262,923 A | 11/1993 | Batta et al. |
| 5,347,430 A | 9/1994 | Curlee et al. |
| 5,351,176 A | 9/1994 | Smith et al. |
| 5,684,271 A | 11/1997 | Scholder et al. |
| 5,726,866 A | 3/1998 | Allen |
| 6,021,909 A | 2/2000 | Tang et al. |
| 6,099,098 A | 8/2000 | Leong |
| 6,163,454 A | 12/2000 | Strickler |
| 6,215,659 B1 | 4/2001 | Chen |

(Continued)

OTHER PUBLICATIONS

Coglitore, U.S. Appl. No. 12/407,744, filed Mar. 19, 2009 for "Rack Mounted Computer System Including Chassis Retainer." Office Actions mailed Apr. 15, 2010 and Sep. 8, 2010; Notice of Allowance mailed Nov. 19, 2010.

(Continued)

*Primary Examiner* — Zachary M Pape
(74) *Attorney, Agent, or Firm* — Morgan, Lewis & Bockius LLP

(57) ABSTRACT

A rack mounted computer system. In one variation the computer rack is configured for side-by-side placement of computers. In another variation, the computer rack includes flanges for supporting the placement of computer units within the rack. In another variation the computer rack is configured with retaining clips. In yet another variation, the computer rack is configured to receive computers with chassis that are adapted for side-by-side placement.

9 Claims, 22 Drawing Sheets

U.S. PATENT DOCUMENTS

| | | |
|---|---|---|
| 6,252,160 B1 | 6/2001 | Chang et al. |
| 6,349,043 B1 | 2/2002 | Mills et al. |
| 6,373,695 B1 | 4/2002 | Cheng |
| 6,414,851 B2 | 7/2002 | Cherniski et al. |
| 6,452,805 B1 | 9/2002 | Franz et al. |
| 6,477,061 B1 | 11/2002 | Johnson |
| 6,480,398 B1 | 11/2002 | Fiora et al. |
| 6,496,366 B1 | 12/2002 | Coglitore et al. |
| 6,512,673 B1 | 1/2003 | Wiley |
| 6,513,770 B1 | 2/2003 | Franz et al. |
| 6,535,390 B1 | 3/2003 | Lo |
| 6,557,709 B2 | 5/2003 | Broome |
| 6,560,114 B2 | 5/2003 | Berry et al. |
| 6,609,619 B2 | 8/2003 | Abbott |
| 6,621,000 B2 | 9/2003 | Jensen et al. |
| 6,862,173 B1 | 3/2005 | Konshak et al. |
| 7,042,720 B1 | 5/2006 | Konshak et al. |
| 7,364,244 B2 | 4/2008 | Sandoval |
| 7,499,286 B2 | 3/2009 | Berke et al. |
| 7,529,097 B2 | 5/2009 | Coglitore et al. |
| 7,911,785 B2 * | 3/2011 | Coglitore et al. ........ 361/679.58 |
| 2002/0020683 A1 | 2/2002 | Broome |
| 2002/0100736 A1 | 8/2002 | Lopez |
| 2002/0140327 A1 * | 10/2002 | Kim .............................. 312/311 |
| 2003/0124971 A1 | 7/2003 | Williams |
| 2003/0128516 A1 | 7/2003 | Faneuf et al. |
| 2004/0022034 A1 | 2/2004 | Coles et al. |
| 2005/0041388 A1 * | 2/2005 | Erickson et al. ............... 361/685 |
| 2005/0265004 A1 | 12/2005 | Coglitore et al. |
| 2009/0178986 A1 | 7/2009 | Coglitore et al. |

OTHER PUBLICATIONS

Coglitore, U.S. Appl. No. 11/125,942, filed May 9, 2005 for "Rack Mounted Computer System." Office Action mailed Sep. 2, 2008; Notice of Allowance mailed Jan. 15, 2009.

* cited by examiner

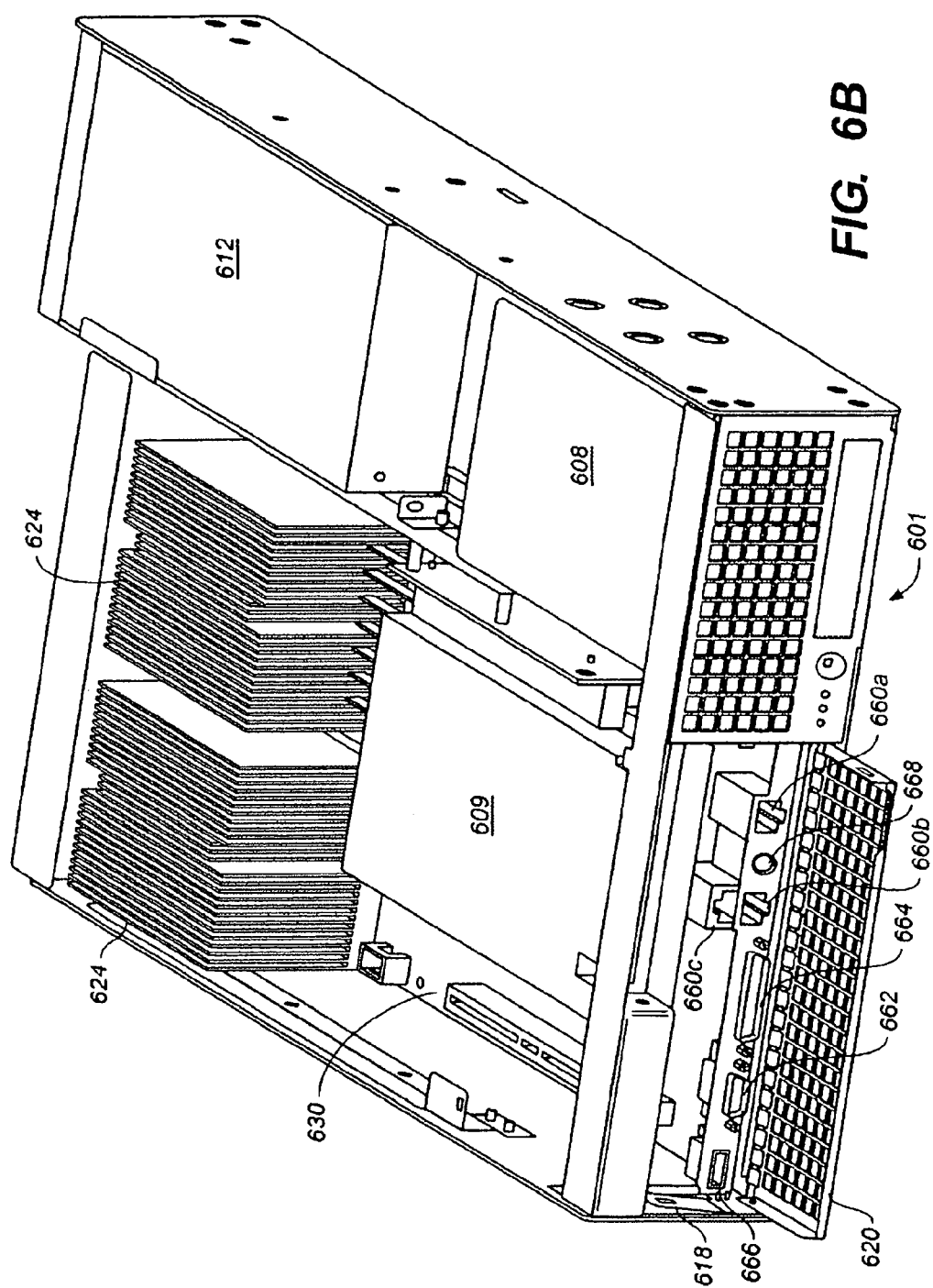

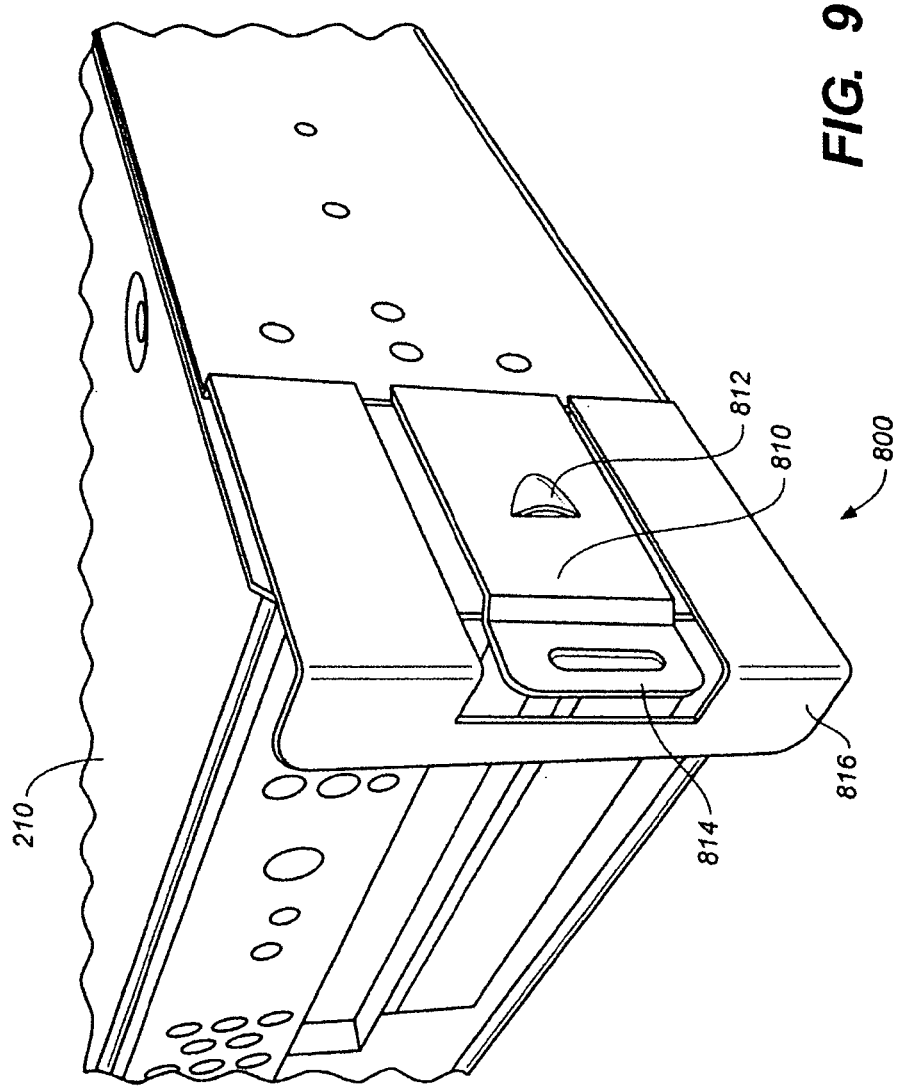

RACK MOUNTED COMPUTER SYSTEM

CROSS-REFERENCE TO RELATED APPLICATION

This application is a divisional application of U.S. application Ser. No. 12/407,744 filed Mar. 19, 2009 entitled "RACK MOUNTED COMPUTER SYSTEM," which is a divisional application of U.S. application Ser. No. 11/125,942, filed May 9, 2005, entitled "RACK MOUNTED COMPUTER SYSTEM," now U.S. Pat. No. 7,529,097 issued May 5, 2009, which claims the benefit of U.S. provisional patent application No. 60/569,025, entitled "RACK MOUNTED COMPUTER SYSTEM" filed on May 7, 2004, U.S. provisional patent application No. 60/568,969 entitled "INTERFACE ASSEMBLY", filed May 7, 2004, U.S. provisional patent application No. 60/569,020 entitled "ELECTROMAGNETIC INTERFERENCE SHIELD FOR I/O PORTS", filed May 7, 2004, and U.S. provisional patent application No. 60/569,019 entitled "DIRECTIONAL FAN ASSEMBLY", filed May 7, 2004, each of which is incorporated herein by reference in it entirety.

BACKGROUND

As information technology has rapidly progressed, computer network centers such as server farms and server clusters have become increasingly important to our society. The server farms provide efficient data processing, storage, and distribution capability that supports a worldwide information infrastructure, which has come to dominate how we live and how we conduct our day to day business.

Typically, at a site where numerous computers are connected to a network, the computers and related equipment are stacked in racks, which are arranged in repeating rows. In conventional systems, the racks are configured to contain computer equipment having a standard size in compliance with the Electronic Industries Alliance ("EIA") "rack unit" or "U" standard. Each computer would have a height of 1U, 2U, or some U-multiple, with each U corresponding to approximately 1.75".

FIG. 1 shows a conventional rack 100 measuring roughly 19 inches wide, 30 inches deep and 74 inches high. This rack 100 is formed of a rectangular frame structure having four vertical supports 102 (two in the front and two in the back), each support 102 having a plurality of holes 104 (typically rectangular) formed along its length. Horizontal rails, which are used to support each individual component to be mounted in the rack, are attached to the vertical supports 102 using cage nuts that are passed through the holes in the supports. Walls may be attached to the sides and top of the frame structure and doors may be provided on the front side 105a and back side 105b in order to provide a complete enclosure for the rack system.

Each computer mounted in the rack 100 may comprise a computer chassis supporting a main board. The main board may be alternatively referred to as the motherboard or system board. The main board comprises the primary printed circuit board (PCB) of a computer. The basic circuitry and components used by a computer to function are generally either contained in or attached to the main board. The main board typically contains the system bus, processor and coprocessor sockets, memory sockets, serial and parallel ports, expansion slots, and peripheral controllers.

By providing the vertical supports with a plurality of holes, a great deal of flexibility in the placement of the horizontal rails can be achieved. Accordingly, a wide variety of heights of components can be accommodated by the rack frame structure. However, the manual positioning and installation of each rail can be a time-consuming and labor-intensive process, significantly increasing the total cost of the system.

A recent trend in rack-based computer systems has been towards increasing the density of computers that will fit into each rack. This increase in density has been achieved by decreasing the height of each computer, while maintaining the width and depth dimensions of the computer so that the computer can still be mounted into a conventional computer rack. Thus, each computer chassis is made very wide, very deep, and very short, often just 1U in height. The motherboard that is contained in each computer is typically a relatively flat printed circuit board which can be easily placed into such a wide, deep, and flat computer chassis. However, layout difficulties arise when trying to add the additional components which are either mounted onto or attached to the motherboard to form a functional computer. These components include, for example, hard drives, removable media drives, power supplies, microprocessors, microprocessor heat sinks, fans, and memory. Because of the low profile of the computer chassis, there is very little room above the motherboard for positioning these components. Generally, the motherboard has a footprint (i.e., width and depth of the motherboard) that is significantly smaller than the footprint of the computer chassis. Thus, these other components are typically positioned in the space available in the chassis adjacent to the motherboard. However, the short height of the chassis limits the number and size of components that can be placed here.

The dense packing of components in these low-profile computer chassis presents cooling problems as well. Rack-based computer systems are typically cooled by directing air through each computer chassis in a front-to-back direction. Because the 1U computer chassis are so thin, any component contained within the computer chassis can significantly impede the flow of air through the computer chassis and across all of the components. This can produce "hot spots", which are regions that do not receive sufficient airflow, thereby enabling heat to accumulate.

This airflow problem can be particularly problematic when attempting to cool the main processor or processors in the computer. Many processors (sometimes referred to as a "central processing unit" or "CPU") generate tremendous amounts of heat during operation and are provided with heat sinks to dissipate this generated heat. These heat sinks may be passive heat sinks, which cool the processor by conducting the heat away from the processor using fins. The heat can then be drawn away from the fins and out of the chassis by the cooling airflow. Alternatively, the heat sinks may be active heat sinks, which actively draw heat away from the processor, using, for example, dedicated processor fans. In either case, the heat sink increases the overall thickness of the processor assembly. In some cases, when the processor and heat sink are mounted onto a motherboard, the overall assembly is over 1.75" thick, preventing its use in 1U chassis systems. Even when the processor and heat sink are sufficiently thin that they can fit into the chassis, there is very little additional clearance around the heat sink, thereby preventing cooling air from effectively cooling the processor. Furthermore, the dense packing of additional components can also impede the flow of air across the processor and heat sink. Accordingly, the progression towards increasing thin rack-based computers has produced both packaging and cooling problems for some computer systems.

Another problem which faces operators of rack mounted computer systems is the difficulty of servicing the computers for repairs or upgrades. Conventional rack mounted computer components may be provided with flanges that extend from the sides of the front face of the computer chassis. Each of these flanges may be configured with two mounting holes which can be aligned with the holes 102 provided on the vertical supports 102 of the rack 100. A pair of screws or bolts may be passed through these aligned holes in each flange in order to secure the computer to the rack 100. Thus, each time the computer chassis is mounted in the rack, these screws need to be attached, and each time the computer chassis is removed, these screws must be detached.

BRIEF SUMMARY

In accordance with embodiments of the present invention, a computer system is provided, comprising: a rack assembly; a first computer system comprising a first computer chassis and a first main board contained in the first computer chassis, the first computer system being supported in the rack assembly such that the first main board is in a substantially horizontal orientation; and a second computer system comprising a second computer chassis and a second main board contained in the second computer chassis, the second computer system being supported in the rack assembly such that the second main board is in a substantially horizontal orientation and the second computer system is laterally adjacent the first computer system.

In accordance with embodiments of the present invention, a method of assembling a computer rack is provided, comprising: forming a first support plate by cutting a first plurality of support flanges in a first plate, the first plate defining a first plane, and bending each of the first plurality of support flanges such that each support flange defines a support surface substantially perpendicular to the first plane; forming a second support plate by cutting a second plurality of support flanges in a second plate, the second plate defining a second plane, and bending each of the second plurality of support flanges such that each support flange defines a support surface substantially perpendicular to the second plane; and positioning the first and second support plates in a computer rack frame such that a plurality of computer chassis can be supported between the first and second support plates by the first and second pluralities of support flanges.

In accordance with embodiments of the present invention, a computer system is provided, comprising: a rack frame; a first plate comprising a first plate body and a first plurality of support rails integrally formed with the first plate body; a second plate opposite the first plate and comprising a second plate body and a second plurality of support rails integrally formed with the second plate body, said first and second pluralities of support rails being positioned to support a plurality of computer chassis.

In accordance with embodiments of the present invention, a rack-mount computer system is provided, comprising: a rack assembly, comprising a plurality of computer bays, each computer bay comprising at least one computer retaining recess provided along an interior portion of the computer bay; and a computer chassis configured to be received in one of the computer bays, the computer chassis comprising a chassis retainer configured to mate with the computer retaining recess when the computer chassis is fully inserted into the computer bay.

In accordance with embodiments of the present invention, a rack-mount computer is provided, comprising: a main board comprising a printed circuit board, at least one processor, and memory; and a computer chassis containing the main board, the computer chassis comprising: a front side having at least one aperture to allow cooling air to pass therethrough, and a back side having at least one aperture to allow cooling air to pass therethrough; wherein the computer chassis has an interior width less than 1" greater than a width of the printed circuit board.

In accordance with embodiments of the present invention, a rack-mount cluster module is provided, comprising: a cluster module chassis comprising a plurality of bays, each bay configured to receive a computer; a rear support provided at a rear portion of each bay; and mounting portions for mounting the cluster module in a vertical orientation in a rack assembly and in a horizontal orientation in a rack assembly.

In accordance with embodiments of the present invention, a rack-mount cluster module is provided, comprising: a cluster module chassis comprising a plurality of bays, each bay configured to receive a computer; and at least one computer mounted in one of the bays, the computer comprising a computer chassis containing a main board; wherein the cluster module chassis is configured to be mounted in a rack assembly in a vertical configuration such that the main board is horizontally oriented and in a horizontal configuration such that the main board is vertically oriented.

Other features and aspects of the invention will become apparent from the following detailed description, taken in conjunction with the accompanying drawings which illustrate, by way of example, the features in accordance with embodiments of the invention. The summary is not intended to limit the scope of the invention, which is defined solely by the claims attached hereto.

BRIEF DESCRIPTION OF THE DRAWINGS

FIGS. 6A-6B are front perspective views of a computer, in accordance with embodiments of the present invention.

FIG. 9 is a perspective front view of an active chassis retainer, in accordance with embodiments of the present invention.

DETAILED DESCRIPTION

In the following description, reference is made to the accompanying drawings which illustrate several embodiments of the present invention. It is understood that other embodiments may be utilized and mechanical, compositional, structural, electrical, and operational changes may be made without departing from the spirit and scope of the present disclosure. The following detailed description is not to be taken in a limiting sense, and the scope of the embodiments of the present invention is defined only by the claims of the issued patent.

Figure 1:
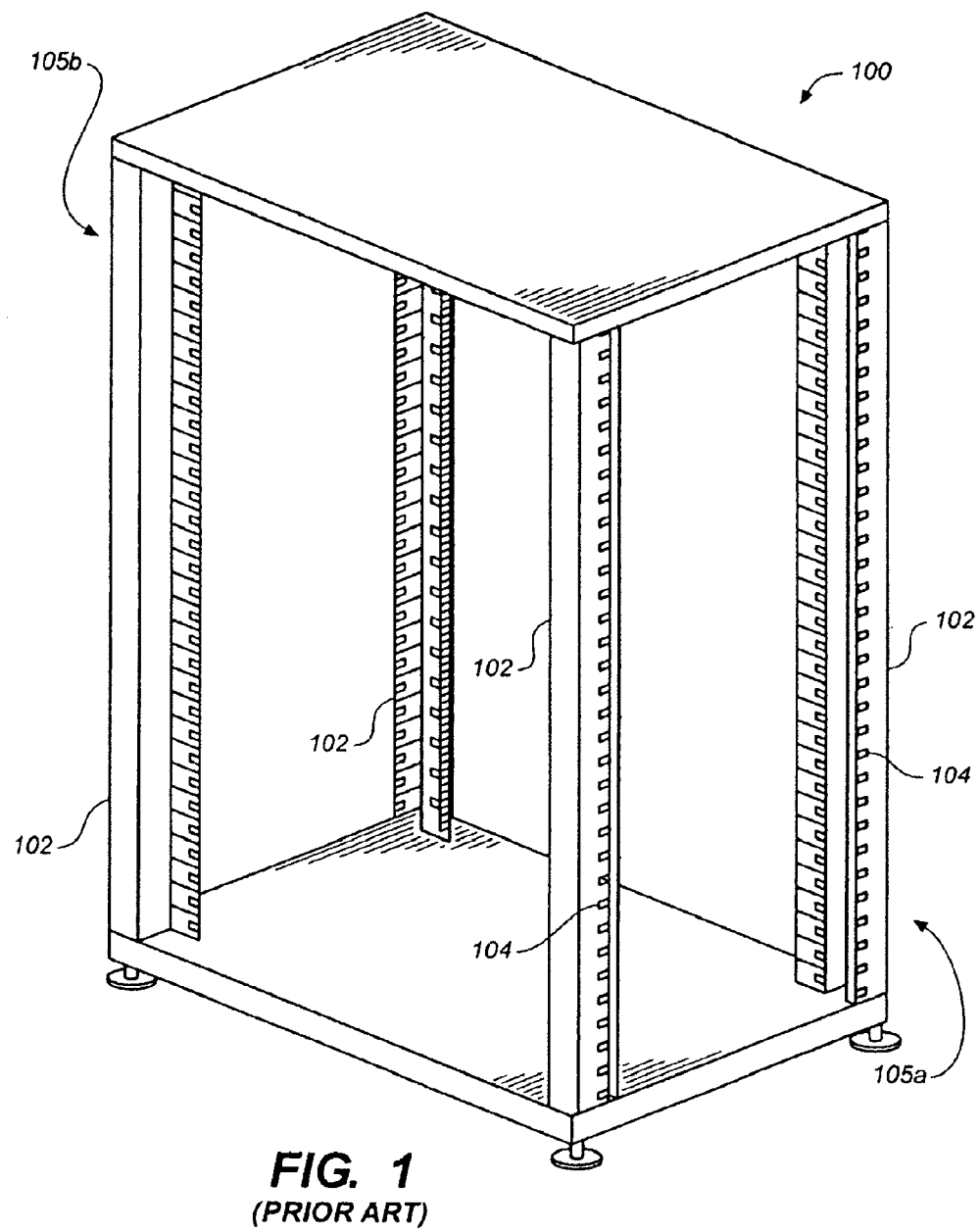
FIG. 1 shows a prior art computer rack.
Figure 2A:
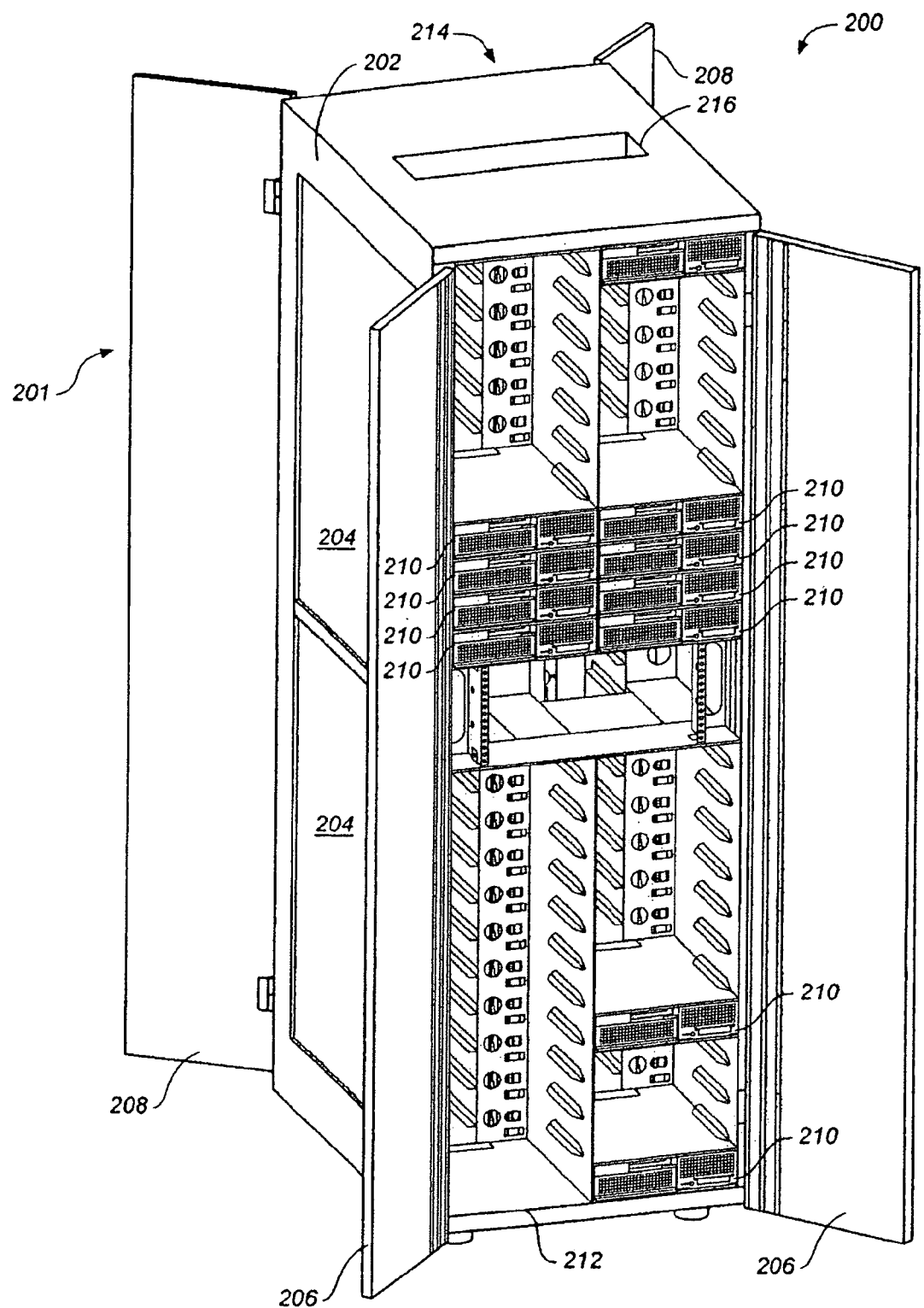
FIGS. 2A-2B show a rack-based computer system, in accordance with embodiments of the present invention.
Figure 2B:
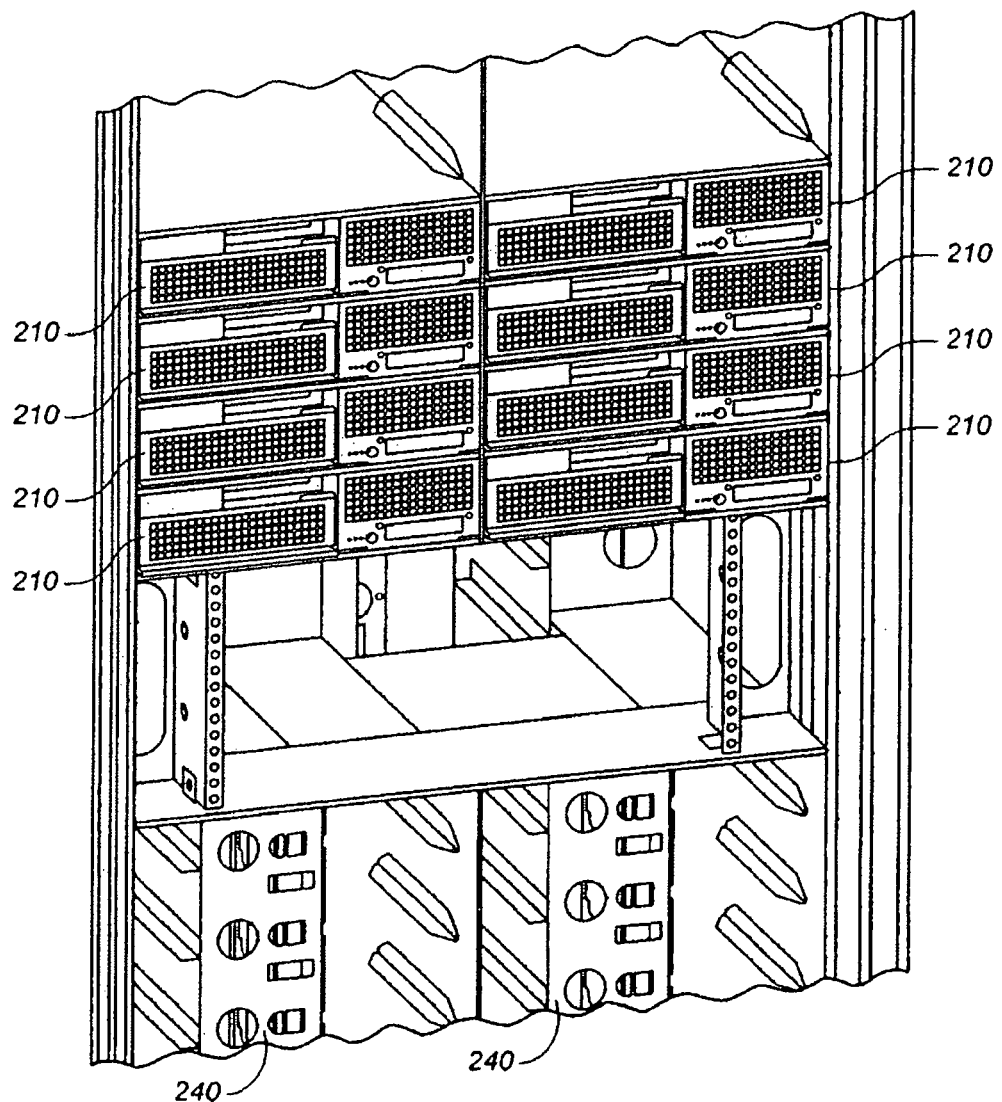

FIG. 2A shows a rack-based computer system 200 in accordance with embodiments of the present invention. FIG. 2B is an enlarged view of a portion of the computer system 200. The computer system 200 comprises a rack assembly 201 which provides the structural support for a plurality of computers 210 contained therein.

The rack assembly 201 may comprise a vertically elongated, floor mounted cabinet assembly. The rack assembly 201 may comprise a rectangular internal rack frame 202 externally covered by removable enclosure panels 204. An access door may be pivotally mounted on one or more sides of the rack assembly to provide access to the computers and other components (such as, e.g., routers, hubs, cabling, etc.) housed in the rack assembly 201. In other embodiments, the enclosure panels and access doors may be omitted or may be integrally formed with the rack frame 202. The rack assembly 201 may comprise a standard-sized rack, or may have different dimensions. In one embodiment, the rack assembly measures approximately 24" wide, 40" deep, and 74" high. In the embodiment illustrated in FIGS. 2A-2B, the rack assembly 201 comprises a front opening 212 and a rear opening 214. Side panels 204, front doors 206, and rear doors 208 are provided for enclosing the computer system 200. In the system 200 illustrated in FIGS. 2A-2B, the rack assembly 201 is only partially filled with computers 210, leaving room to add additional computers 210 into the system 200.

As can be seen in FIGS. 2A-2B, the computers 210 are positioned in a side-by-side orientation. Thus, when viewing the computers 210 through the front opening 212, two computers 210 can be seen positioned at each horizontal section of the rack assembly 201. Each computer 210 includes its own horizontally-oriented main board and other components to form a computer. This is in contrast with conventional rack-based systems in which each horizontal section of the rack contains a single computer chassis containing a single horizontally-oriented main board. This is also in contrast with conventional blade-type computer systems which may include multiple vertically-oriented blades arranged side-by-side.

In addition to the side-to-side arrangement of the computers 210, the rack assembly 201 may also support computers in a back-to-back arrangement. Thus, another set of side-by-side computers 210 can be accessed from the rear opening 214 of the rack assembly 201. The perspective view of the rear opening 214 would be similar to the perspective view of the front opening 212 shown in FIG. 2A. Thus, four vertically arranged stacks of computers 210 may be provided in the computer system 200. During operation, cooling air may be drawn through the computers 210 into a central air plenum positioned between the back sides of the computers 210 and then exhausted out of an exhaust port, such as top exhaust port 216.

Figure 3:
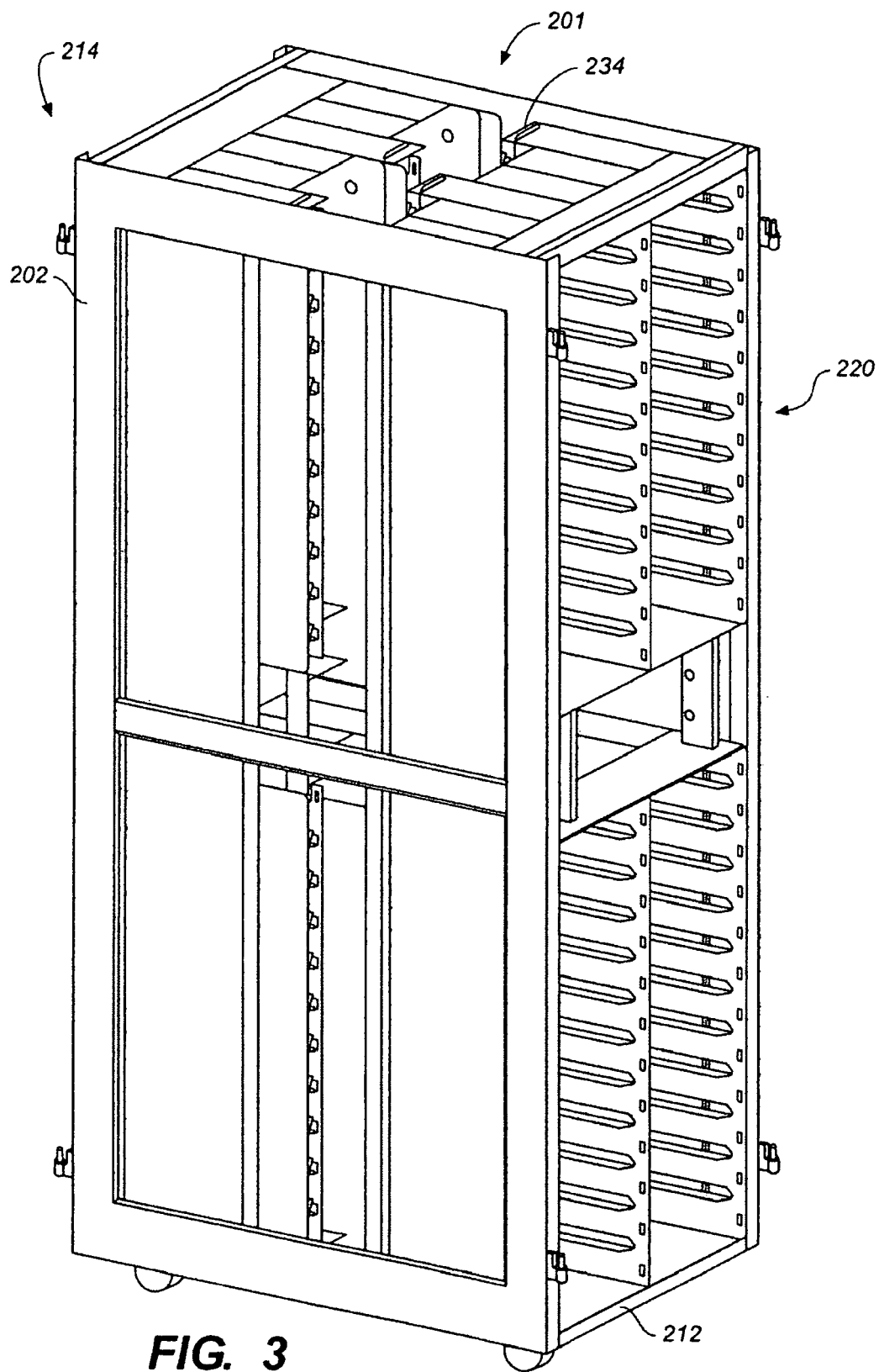
FIG. 3 is a perspective view of a rack assembly, in accordance with embodiments of the present invention.

FIG. 3 is a perspective view of the rack assembly 201 with front doors 206, rear doors 208, side panels 204, and computers 210 removed. The illustrated rack assembly 201 comprises a rack frame 202, which provides the main structural support for the various components of the computer system 200.

Figure 4:
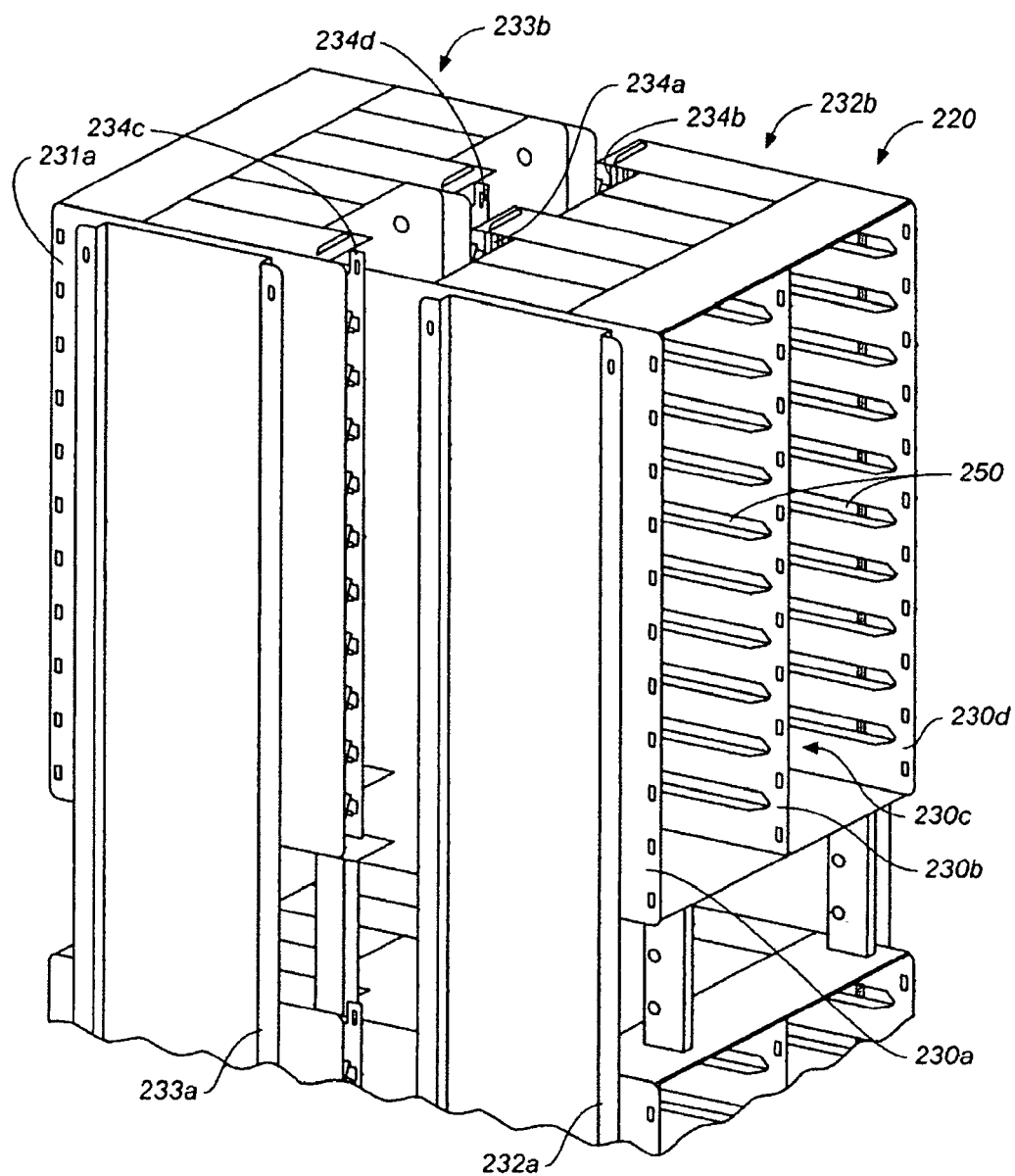
FIG. 4 is a perspective view of a portion of the rack assembly with the rack frame removed, in accordance with embodiments of the present invention.
Figure 5:
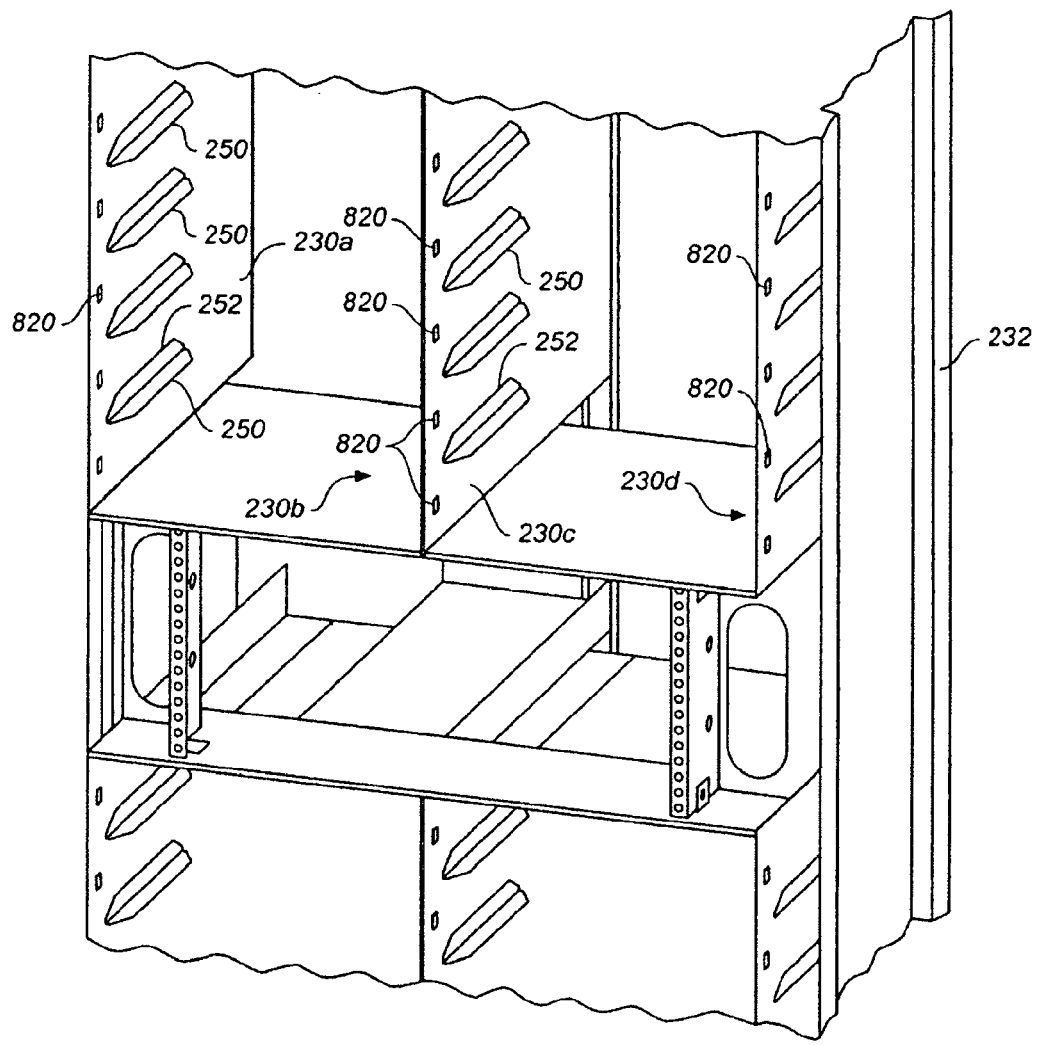
FIG. 5 is an enlarged perspective view of a central portion of the front portion of the computer system, in accordance with embodiments of the present invention.

FIG. 4 is a perspective view of a portion of the rack assembly 201 with the rack frame 202 removed. In this figure, the internal support structure 220 can be seen. The internal support structure 220 is supported by the rack frame 202 and comprises a front pair of mounting members 232a-232b and a rear pair of mounting members 233a-233b. The front mounting members 232a-232b are coupled to the rack frame 202 and support the front computer support plates 230a-230d. The rear mounting members 232b are also coupled to the rack frame 202 and support the rear computer support plates 231a-231d. The internal support structure 220 also comprises a plurality of rear supports 234, which are positioned to abut the back sides of the computers 210 when the computers 210 are fully inserted into the rack assembly 201. A first pair of rear supports 234a-234b are positioned to abut the back sides of the computers 210 in the front section of the rack assembly 201, and second pair of rear supports 234c-234d are positioned to abut the back sides of the computers 210 in the back section of the rack assembly 201. FIG. 5 is an enlarged perspective view of a central portion of the front section of the computer system 200.

Although the terms "front" and "rear" are used to describe various components in the illustrated computer system 200, it will be understood that these are relative terms used here for convenience. In the illustrated embodiment, the front section of the computer system 200 and the rear section of the computer system 200 are substantially identical, but oriented in opposite directions so that the front sides 601 of the computers 210 mounted in the front section can be accessed through the front opening 212, and the front sides 601 of the computers 210 mounted in the rear section can be accessed through the rear opening 214. The following text describes the front portion of the computer system 200. However, it will be understood that the description may apply to the rear portion as well.

Figure 6A:
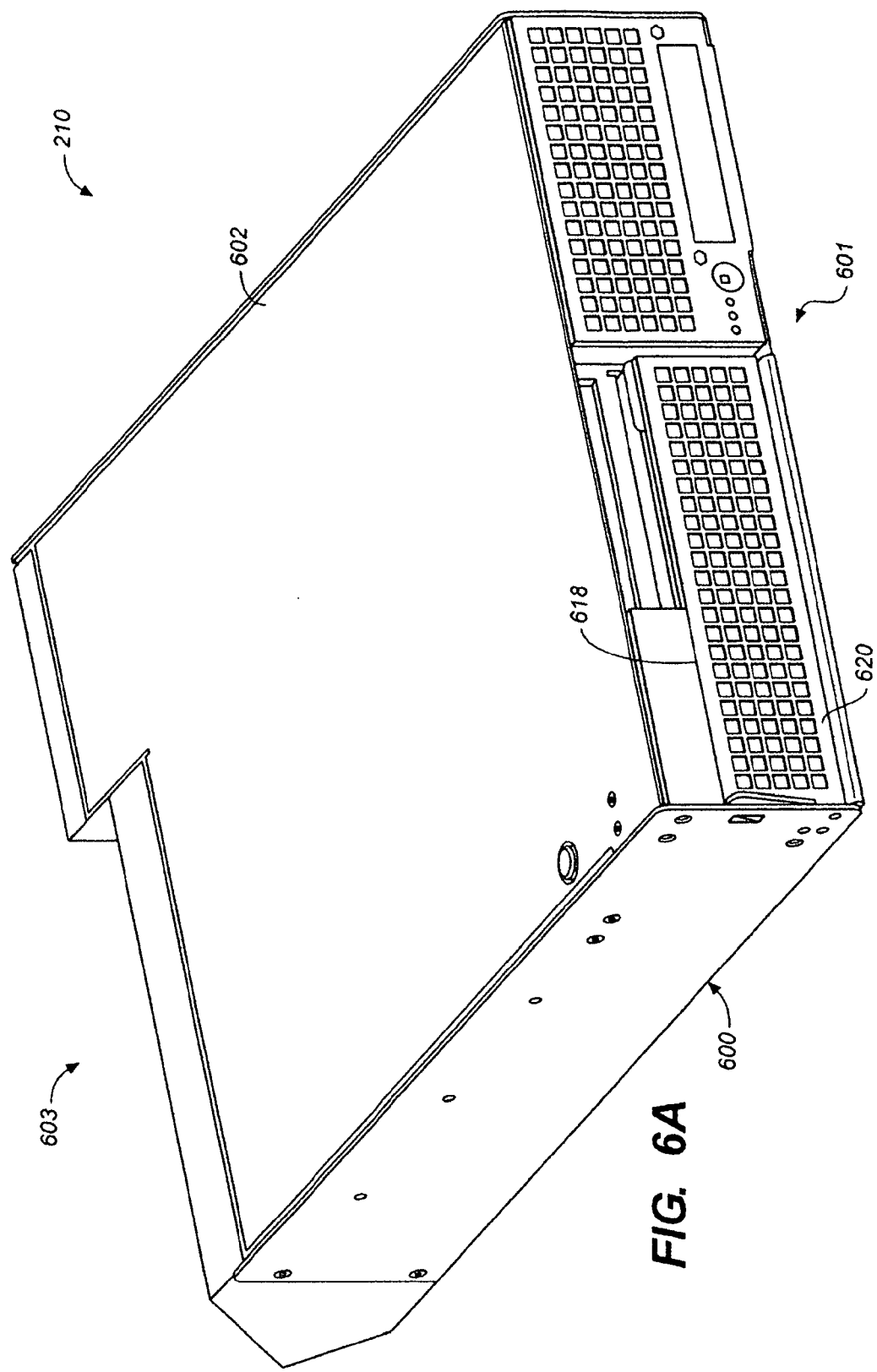

FIGS. 6A-6B are front perspective views of a computer 210 that can be mounted into the rack assembly 201. The computer 210 may comprise a computer chassis 600 containing a main board 610 and other components, such as one or more power supplies 612, hard drives 608, removable media drives 609, processors 624, and expansion cards, contained within the computer chassis 600. The chassis 600 may comprise a chassis top 602, which may be removable to provide access to the components contained therein. An exemplary computer 210 is described in greater detail in the following U.S. provisional patent applications, the disclosures of which are incorporated by reference herein in their entireties: U.S. provisional patent application No. 60/568,969 entitled "INTERFACE ASSEMBLY", filed May 7, 2004; U.S. provisional patent application No. 60/569,020 entitled "ELECTROMAGNETIC INTERFERENCE SHIELD FOR I/O PORTS", filed May 7, 2004; and U.S. provisional patent application No. 60/569,019 entitled "DIRECTIONAL FAN ASSEMBLY"; filed May 7, 2004.

A computer 210 may comprise any electronic system designed to perform computations and/or data processing. In some embodiments, the computer 210 comprises an electronic device having a central processing unit (CPU) and memory. The CPU and memory may be provided on a main board 610, which, in turn, may be mounted to the computer chassis 600. The basic circuitry and components used by a computer to function are generally either contained in or attached to the main board. The main board typically contains the system bus, processor and coprocessor sockets, memory sockets, serial and parallel ports, expansion slots, and peripheral controllers. This chassis 600 may comprise, for example, a housing that encloses all or portions of the main board 610 and components coupled thereto. Alternatively, the chassis 600 may comprise a minimal structure (such as, e.g., a tray or frame) which provides mechanical support for the main board 610. Alternatively, the computer may comprise a printed circuit board (PCB) main board having exposed components without an enclosure.

FIG. 6B is a perspective view of the front side 601 of the computer 210 with the chassis top 602 removed to expose the main board 630 and other components contained within the computer chassis 600. When the computers 210 are mounted in the rack assembly 201, the front sides 601 of the computers 210 are exposed to a user facing the front opening 212 of the rack assembly 201. As can be seen in FIGS. 6A-6B, the front side 601 of the computer 210 exposes various components which a user may wish to access to operate or maintain the computer system 200. These components may include, for example, one or more removable media drive ports, a mass storage device, and I/O connectors. The computer 210 may be provided with a front bezel which partially or fully covers the front of the computer 210. This bezel may be removable or pivotally mounted to enable the bezel to be opened to provide access to the various components. The bezel may function to reduce the effect of electromagnetic interference (EMI), to minimize the impact of environmental factors, and to improve the aesthetic appearance of the computer 210. In the embodiment illustrated in FIGS. 6A-6B, the I/O connectors are exposed by an I/O connector opening 618 in the computer chassis 600. The I/O connector opening 618 is covered by a movable I/O door 620, which provides EMI shielding.

Figure 7:
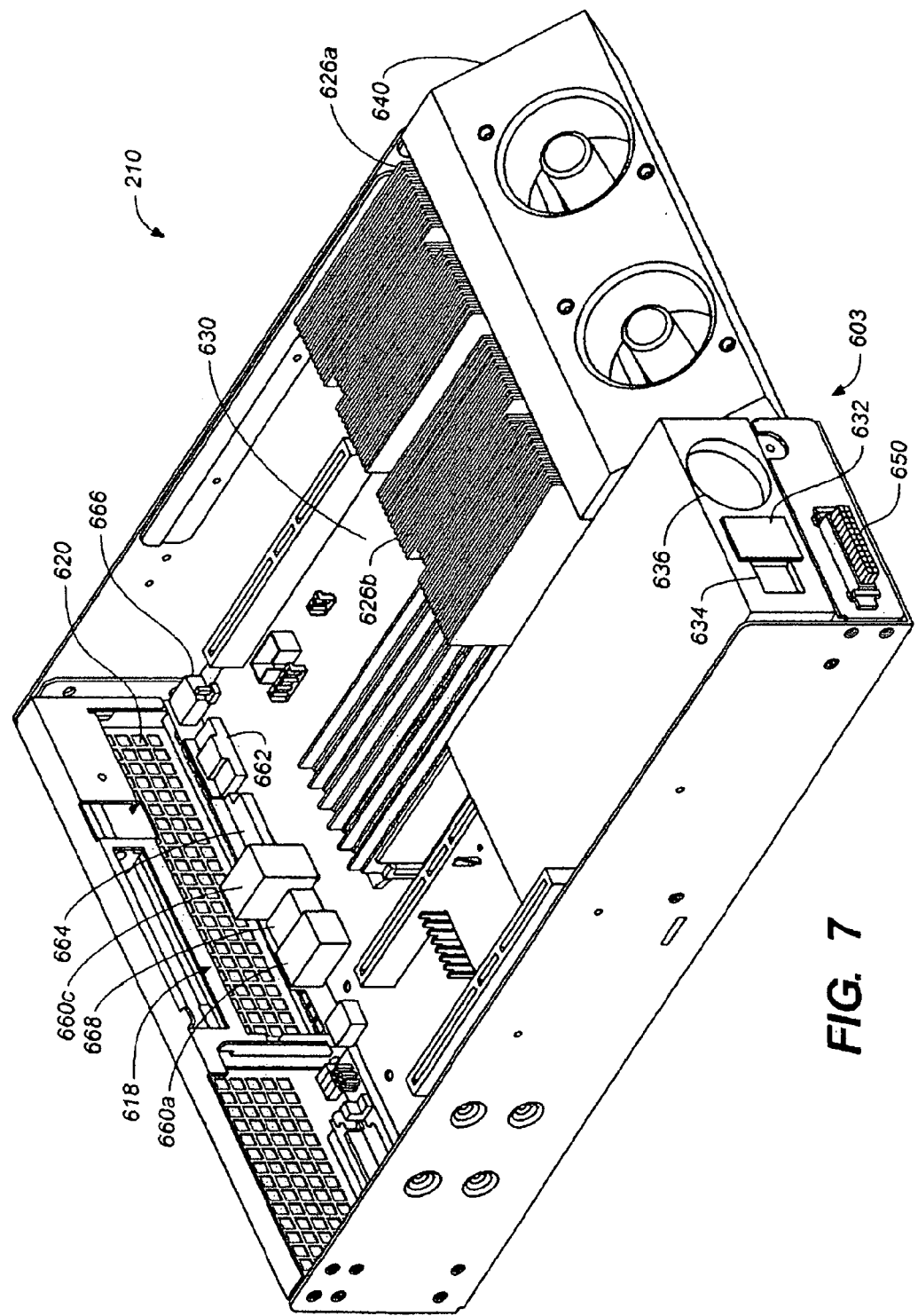
FIG. 7 is a perspective view of the rear side of the computer, in accordance with embodiments of the present invention.

FIG. 7 is a perspective view of the rear side 603 of the computer 210. The rear side 603 of the computer chassis 600 may comprise a directional fan assembly 640, a power port opening 632 for exposing a power connector of a power supply 612, a power switch opening 634, a power supply fan opening 636, and a chassis connector 650. In other embodiments, the rear side 603 may also include one or more additional apertures to accommodate other components, such as additional fans or I/O connectors, which may be to alternative designs of the computer 210.

Chassis Retainer

Figure 8:
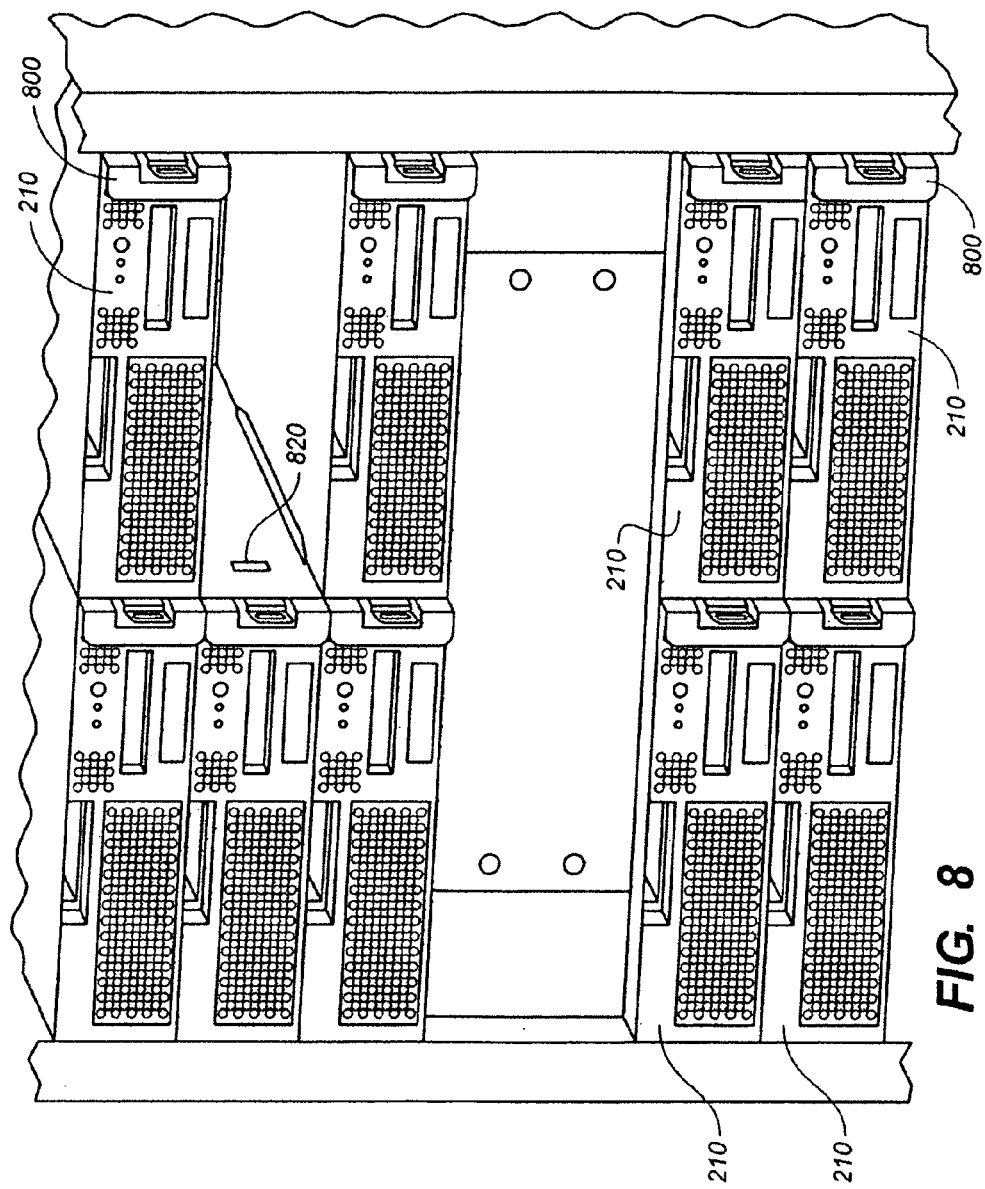
FIG. 8 is a perspective front view of a computer system, in accordance with embodiments of the present invention.

FIG. 8 is another embodiment of the rack-based computer system 200, in which active chassis retainers 800 may be used to releasably retain the computers 210 in the rack assembly 201. FIG. 9 is an enlarged perspective view of an exemplary active chassis retainer 800 mounted to one side of the computer chassis 600. In this embodiment, the chassis retainer 800 comprises a cantilevered flange 810 having a protruding portion 812 which mates with a corresponding recess 820 in the front support plate 230d when the computer 210 is fully inserted into the rack assembly 201. The cantilevered flange 810 has an outward bias which urges the protruding portion 812 outward. The chassis retainer 800 may also comprise a release member 814 and a handle 816 that extend beyond the front face of the computer 210. The user may push on the handle 816 to insert the computer 210 into the bay, or may pull on the handle 816 to retrieve the computer 210 from the bay, as will be described in greater detail below.

When the computer 210 is fully inserted into an available bay in the rack assembly 201, the outward bias of the flange 810 causes the protruding portion 812 to be received into the recess 820. The engagement of the protruding portion 812 with the recess 820 may help to prevent the computer 210 from being inadvertently dislodged from the fully inserted position. This may also provide a tactile and audible feedback to the operator indicating that the computer 210 has been fully inserted into the bay. When the operator wishes to remove the computer 210 from the rack assembly 201, the user may apply a lateral force onto the release member 814 opposing the outward bias of the flange 810, thereby withdrawing the protruding portion 812 from the recess 820. The user may then pull on the handle 816 to withdraw the computer 210 from the bay.

Figure 10A:
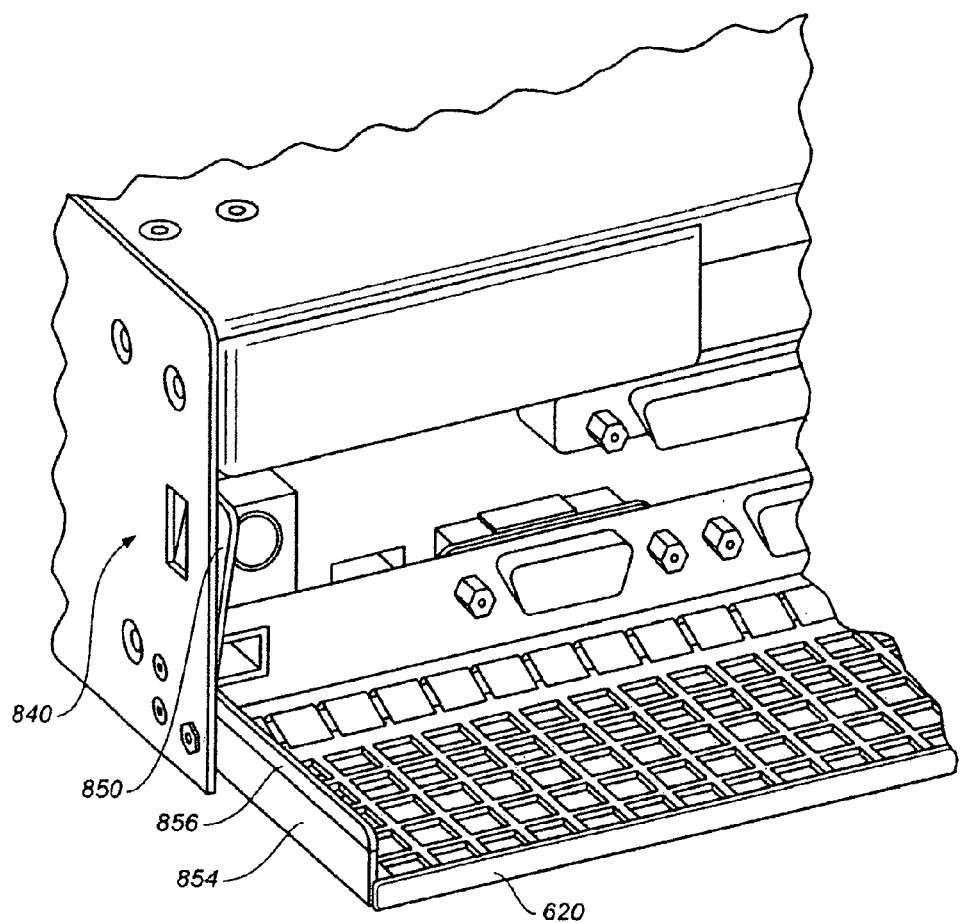
FIGS. 10A-10B are perspective front views of a passive chassis retainer, in accordance with embodiments of the present invention.
Figure 10B:
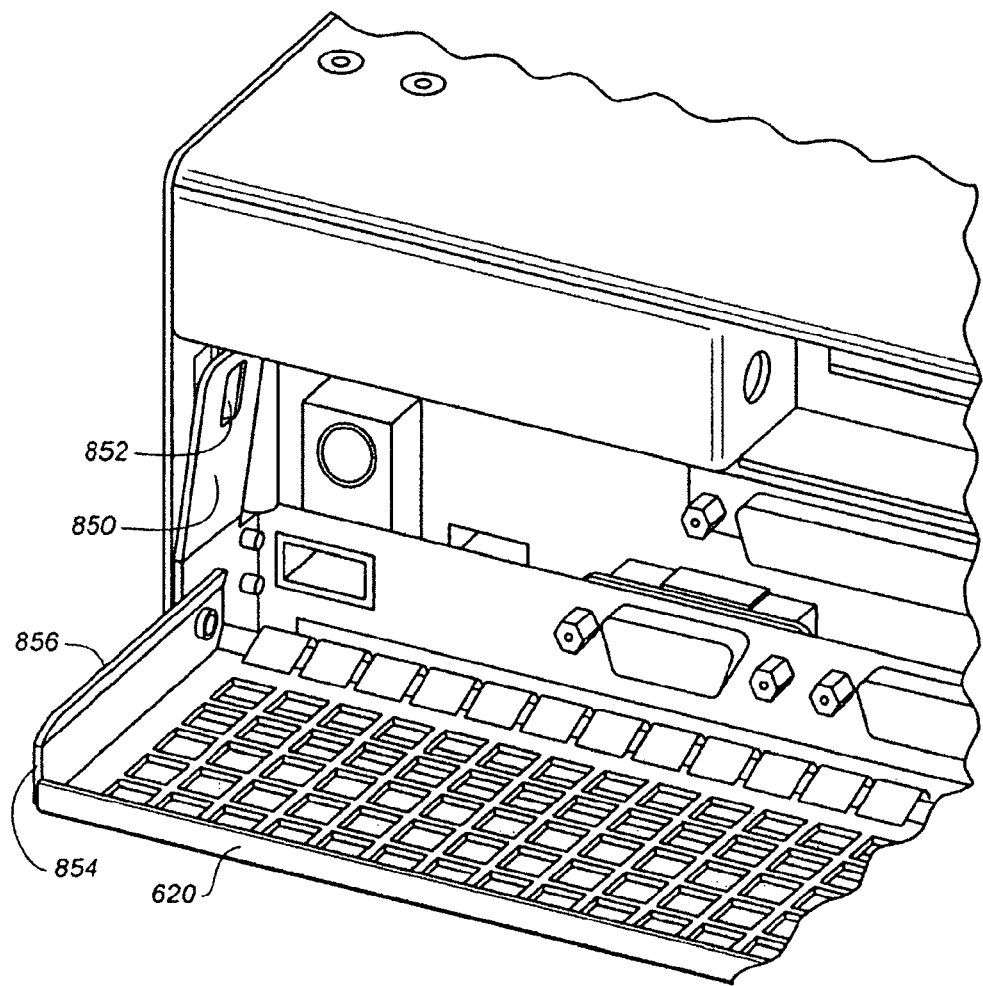

FIGS. 10A-10B are perspective views of the opposite side of the computer 210. In accordance with some embodiments, a passive chassis retainer 840 may be used to retain the computer 210 in the bay of the rack assembly 201. In the illustrated embodiment, the passive chassis retainer 840 comprises a flange 850 having a protruding portion 852 which mates with a corresponding recess 820 in the front support plate 230c when the computer 210 is fully inserted into the rack assembly 201. In this case, the flange 850 has an inward bias which urges the protruding portion 812 away from the support plate 230c. The I/O door 620 comprises a lip 854 having an angled portion 856. When the I/O door 620 is in the open position, as shown in FIGS. 10A-10B, the lip 854 does not engage the flange 850. However, when the I/O door 620 is closed, the lip 854 engages the flange 850 to oppose the inward bias of the flange 850 and urge the protruding portion 852 outward. When the I/O door 620 is fully closed, the protruding portion 852 is received into the recess 820, thereby preventing the computer 210 from being removed. Thus, the passive chassis retainer 840 is actuated by opening and closing the I/O door 620.

During use, when an operator wishes to insert a computer 210 into an available bay in the rack assembly 201, the operator first opens the I/O door 620, thereby allowing the protruding portion 852 to be withdrawn into the interior of the computer 210 due to the inward bias of the flange 850. The computer 210 can then be inserted into the rack assembly 201. Once the computer 210 is fully inserted, the I/O door 620 may be closed, thereby actuating the chassis retainer 840 and locking the computer 210 in the bay. To withdraw the computer 210, the I/O door 620 is first opened, thereby allowing the natural bias of the flange 850 to pull the protruding portion 852 away from the recess 820. The operator can then pull on the handle 816 and/or use the I/O door 620 as a handle to withdraw the computer 210.

In other embodiments, the I/O door 620 may be, for example, spring-loaded to provide a bias on the I/O door 620 urging the I/O door 620 towards the closed position. Thus, during insertion, an operator manually holds the I/O door 620 in the open position in order to release the flange 850. Once the operator releases the I/O door 620, the I/O door 620 will automatically close, thereby actuating the retainer 840.

In some embodiments, the protruding portion 852 may enable the computer 210 to be inserted even when the I/O door 620 is closed. In the embodiment illustrated in FIGS. 10A-10B, the protruding portion 852 is cantilevered such that when the I/O door 620 is closed, thereby urging the flange 850 outwards, the protruding portion 852 can flex to allow the computer 210 to be received in the bay. When the computer 210 is inserted into the bay, the protruding portion 852 will bend inwards to clear the support plate 230c. Once the protruding portion 852 reaches the recess 820, the protruding portion 852 springs outward, thereby preventing the computer 210 from being withdrawn from the bay without first opening the I/O door 620.

In various embodiments, one or both types of chassis retainers 800, 840 may be used. The chassis retainer 800 is an active retainer, which automatically locks the computer 210 into the bay once the computer 210 is fully inserted. The chassis retainer 840 is a passive retainer, which is actuated by the opening and closing of the I/O door 620. In the illustrated embodiment, the chassis retainer 800 is used on one side of the computer 210 and the door-actuated chassis retainer 840 is used on the opposite side. This can advantageously provide both active and passive mechanisms for retaining the computer 210 in the rack assembly 201. In addition, the feedback from the active retainer 800 indicating that the computer 210 is fully inserted may be used as an indicator that the passive retainer 840 is in position to be actuated. In other embodiments, a single active retainer 800 on a single side of the computer 210 may be used. In other embodiments, two or more active retainers 800 may be used with at least one retainer 800 on each side. Similarly, in other embodiments, one or more passive retainers 840 may be used.

In accordance with various embodiments, the chassis retainers 800, 840 may provide advantages over conventional designs. In many conventional computer systems, the computers are attached to the rack assembly using thumbscrews which pass through flanges extending from the sides of the front of the computer and mate with openings provided on the rack assembly. When installing or servicing large numbers of computers, the screwing and unscrewing of these thumbscrews can be a tedious and time-consuming process. The use of chassis retainers 800 and 840 can enable the computers to be very rapidly retained and released from the rack assembly. In addition, the chassis retainer 800 can be easily manufactured and installed onto a variety of computer chassis designs.

Computer Support Rails

Figure 11A:
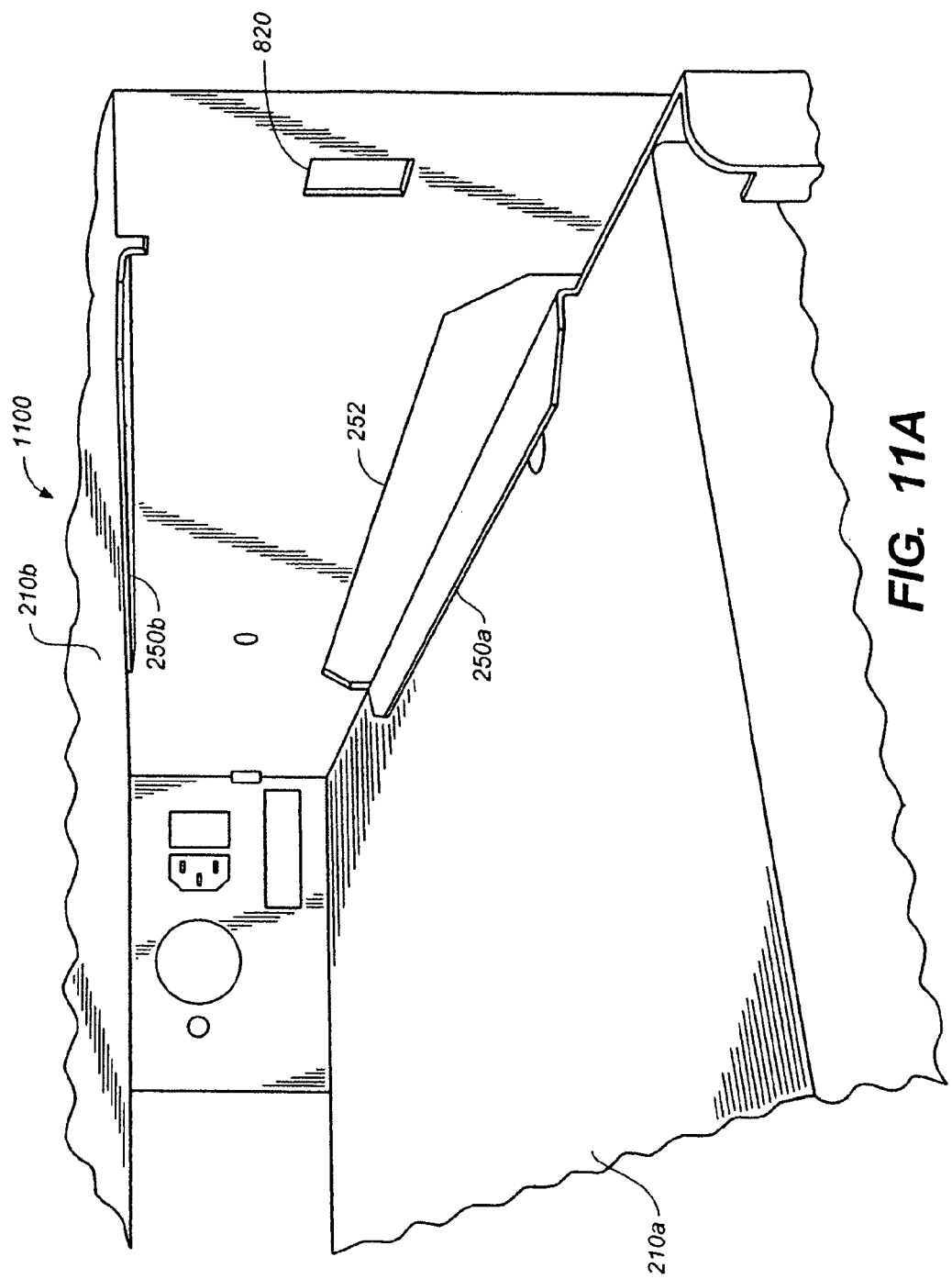
FIGS. 11A-11B are perspective views of an empty bay in a rack assembly, in accordance with embodiments of the present invention.
Figure 11B:
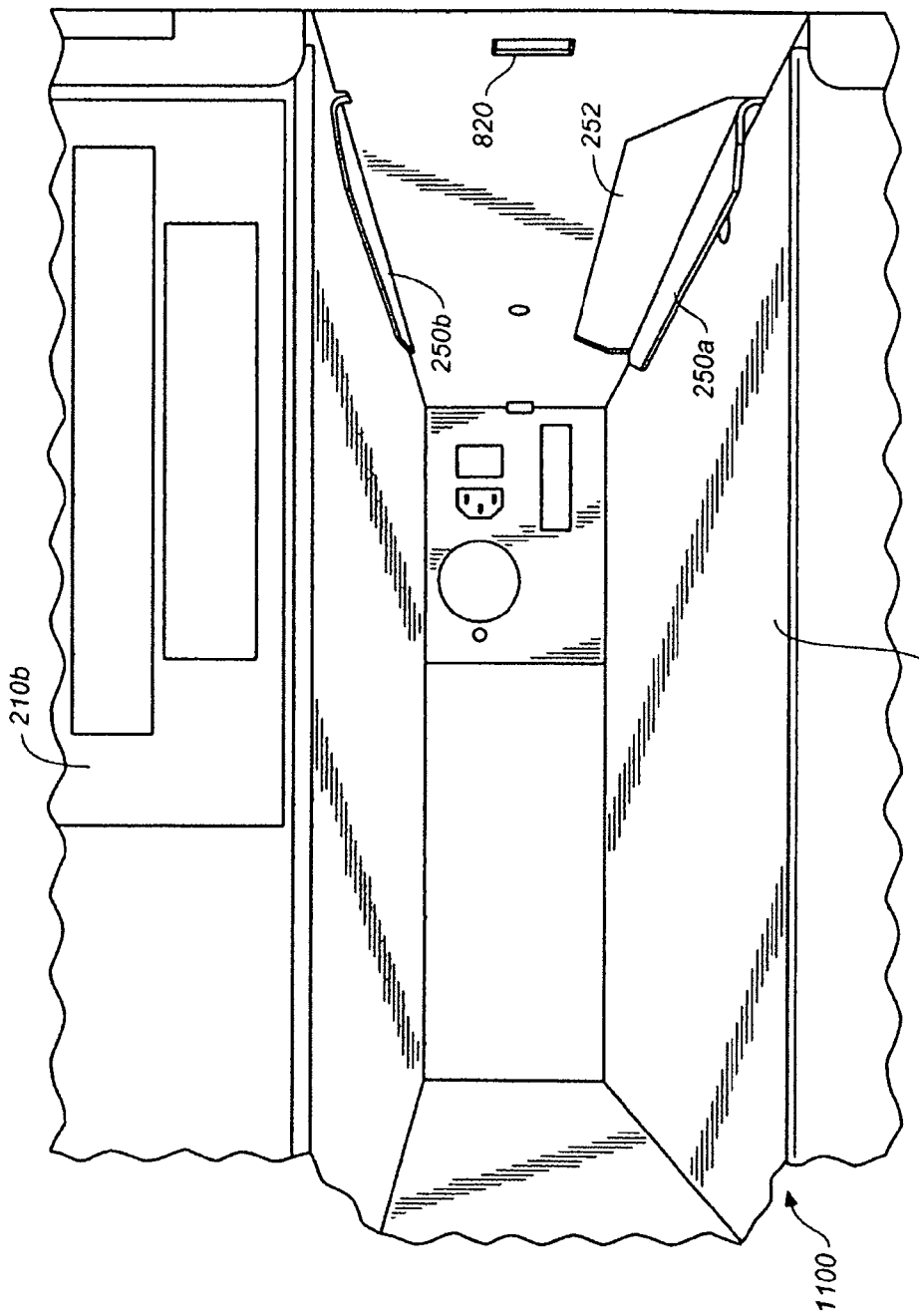

In accordance with embodiments of the present invention, the rack assembly 201 may comprise a support rail system for supporting the computers 210 mounted in the rack assembly 201. FIGS. 11A-11B are perspective views of an empty bay 1100 in the rack assembly 201. In these figures, it can be seen that the support plates 230 comprise a plurality of support flanges 250. These support flanges 250 may be created by forming a U-shaped cut 252 in a first support plate 230d and then bending the portion of metal inside of the U-shaped cut 252 such that the portion defines a plane substantially perpendicular with the plane defined by the remainder of the support plate 230d. This bent portion forms the support flange 250, which provides a support surface for one side of a computer 210 being mounted in the rack assembly 201. Similarly, a second support flange 250 may also be formed in a second support plate 230c opposite the bay 1100 from the first support plate 230d. When a computer 210 is inserted into the bay 1100, a first side of the computer 210 is supported by the first support flange 250 and a second side of the computer 210 is supported by the second support flange 250.

In accordance with some embodiments, each support flange 250 may serve to support a first computer 210 on one side and may further serve to abut a second computer 210 positioned adjacent the first computer 210 in order to securely retain the second computer 210 in place. This can be seen in FIGS. 11A-11B, which shows a first computer 210a positioned below the empty bay 1100 and a second computer 210b positioned above the empty bay 1100. Here, the first support flange 250a contacts the top of the first computer 210a to prevent the first computer 210a from being inadvertently dislodged upwards out of the desired location. In addition, the first support flange 250a would provide upward support for any computer 210 that was inserted into the bay 1100. Similarly, the second support flange 250b currently provides upward support for the second computer 210b, and could provide a downward retaining support for any computer 210 inserted into the bay 1100.

In accordance with various embodiments, the support flanges 250 may provide an inexpensive structure for reliably supporting the computers 210 in the rack assembly 201. In conventional systems, each horizontal support rail in a rack assembly is manually attached to the vertical supports of the rack frame. Although this may provide flexibility in accommodating differently sized computer chassis, the assembly process can be very time-consuming and does not facilitate rapid deployment of large numbers of computer systems. In contrast, the support plates 230 incorporating the support flanges 250 can be very rapidly and inexpensively manufactured and installed into the rack assembly 201. Using the illustrated embodiment, the support rails for all of the computers for a section of a rack assembly or for an entire side of a rack assembly can be installed by attaching a pair of support plates 230 to the rack frame 202.

If it is desired to use differently sized computer chassis in the rack assembly 201, the support plates 230 can be quickly removed and replaced with a support plate 230 having support flanges 250 formed with the desired spacing. When the support plates 230 and support flanges 250 are formed from single sheets of metal, the cost of replacing the support plates 230 may be negligible relative to the ease of assembly.

Computer Chassis

In accordance with some embodiments, the computer 210 comprises a computer chassis 600 having an improved design and form factor. As described above, conventional rack-based computer system manufacturers adhere to common computer chassis designs which are configured to extend the entire interior width of an EIA standard 19" rack. For example, the interior of a standard 44U rack is approximately 19" wide, approximately 40" deep, and approximately 77" tall. In order to increase the number of computers that can be mounted in a single rack, these manufacturers typically reduce the height of the chassis but maintain the width. This results in a flat, wide, "pizza box"-type chassis configuration. A typical 1U server may have a height of approximately 1.7", a width of approximately 17", and a depth of approximately 24". While this chassis form factor may be suitable for housing wide, flat components, it is not convenient for containing tall components. In addition, with an exterior height of just 1.7", any components contained within the chassis may substantially block the cooling airflow through the chassis. Although 2U, 3U, or 4U height chassis are available, these conventional systems typically maintain the same width as the conventional 1U server.

Figure 12:
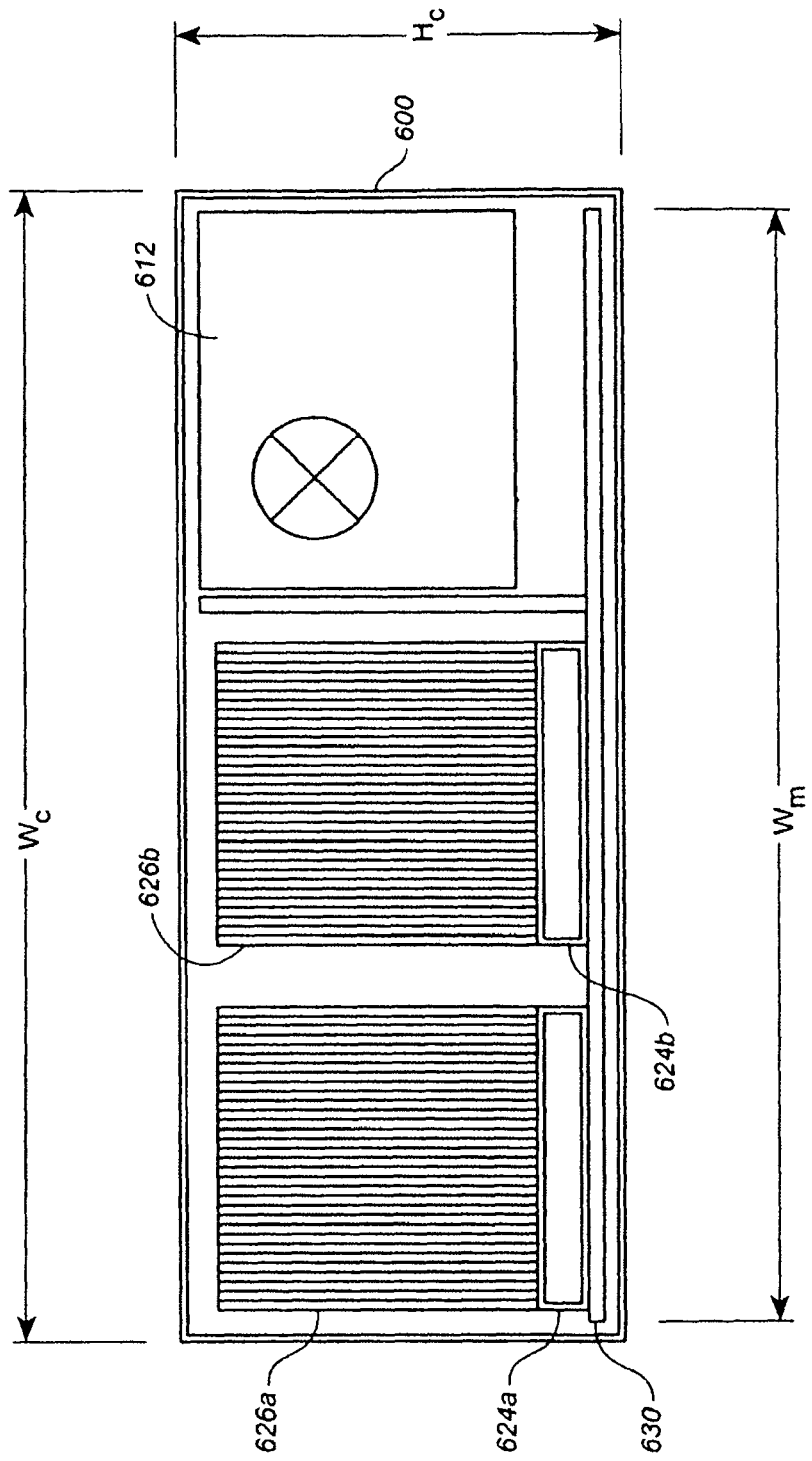
FIG. 12 is a front cross-sectional view of a computer, in accordance with embodiments of the present invention.

FIG. 12 shows a cross-sectional block diagram of a computer 210 in accordance with embodiments of the present invention. The computer 210 comprises a computer chassis 600 having a height, $H_c$, of approximately 3.1", a width, $W_c$, of approximately 12.15", and a depth of approximately 16.7". In this embodiment, the computer chassis has a width-to-height ratio of approximately 3.9. A conventional 1U rack-mount server may have a width-to-height ratio of approximately 10. Even a 2U rack-mount server may have a width-to-height ratio of greater than 4.9.

In addition to having a width-to-height ratio less than the conventional ratio, the computer chassis 600 has a width that is substantially less than the standard EIA 19" rack-compliant computer chassis. As shown in FIG. 12, the computer chassis 600 has a width that is only slightly larger than the width of the main board 630 contained therein. For example, in FIG. 12, the main board 630 comprises a standard EATX ("extended ATX") motherboard having a width, $W_M$, of just under 12". Thus, the main board 630 fills substantially the entire width of the computer chassis 600.

In conventional rack-mount computers, many of the various computer components, such as the hard drives, removable media drives, and power supply, are positioned adjacent to the main board. In the computer 210, because the main board 630 consumes substantially the entire interior width of the computer chassis 600, there is no room adjacent to the main board available for the placement of additional components. In accordance with embodiments of the present invention, due to the increased height of the computer chassis 600, these components may be mounted above the main board 630.

Another advantage of utilizing a taller form factor computer chassis 600 is that processors 624 having tall heat sinks 626 may be used, as shown in FIG. 12. Tall heat sinks 626 may comprise a plurality of heat-conducting fins that draw heat away from the processors 624 and onto the fins, where the heat can be drawn away by the cooling air flowing past the fins. Increasing the height of the heat sinks 626 may improve the heat sinks' ability to cool the processors 624.

It may be desirable to position large computer components, such as the power supply 612, above the main board 630 but laterally adjacent to the processors 624 and heat sinks 626. As a result, cooling air which flows front-to-back (i.e., enters the front of the computer 210 and exits out of the back of the computer 210) or back-to-front (i.e., enters the back of the computer 210 and exits out of the front of the computer 210) will flow past the processors 624 and heat sinks 626 without being impeded by the large components, such as the power supply 612.

As shown in FIG. 2A, computers 210 having these form factors may be mounted in a rack assembly 201 in a side-by-side and back-to-back configuration. In other words, these computers 210 may be mounted such that the front half of the rack assembly 201 supports two stacks of computers 210 and the back half of the rack assembly 201 support another two stacks of computers 210.

Figure 13:
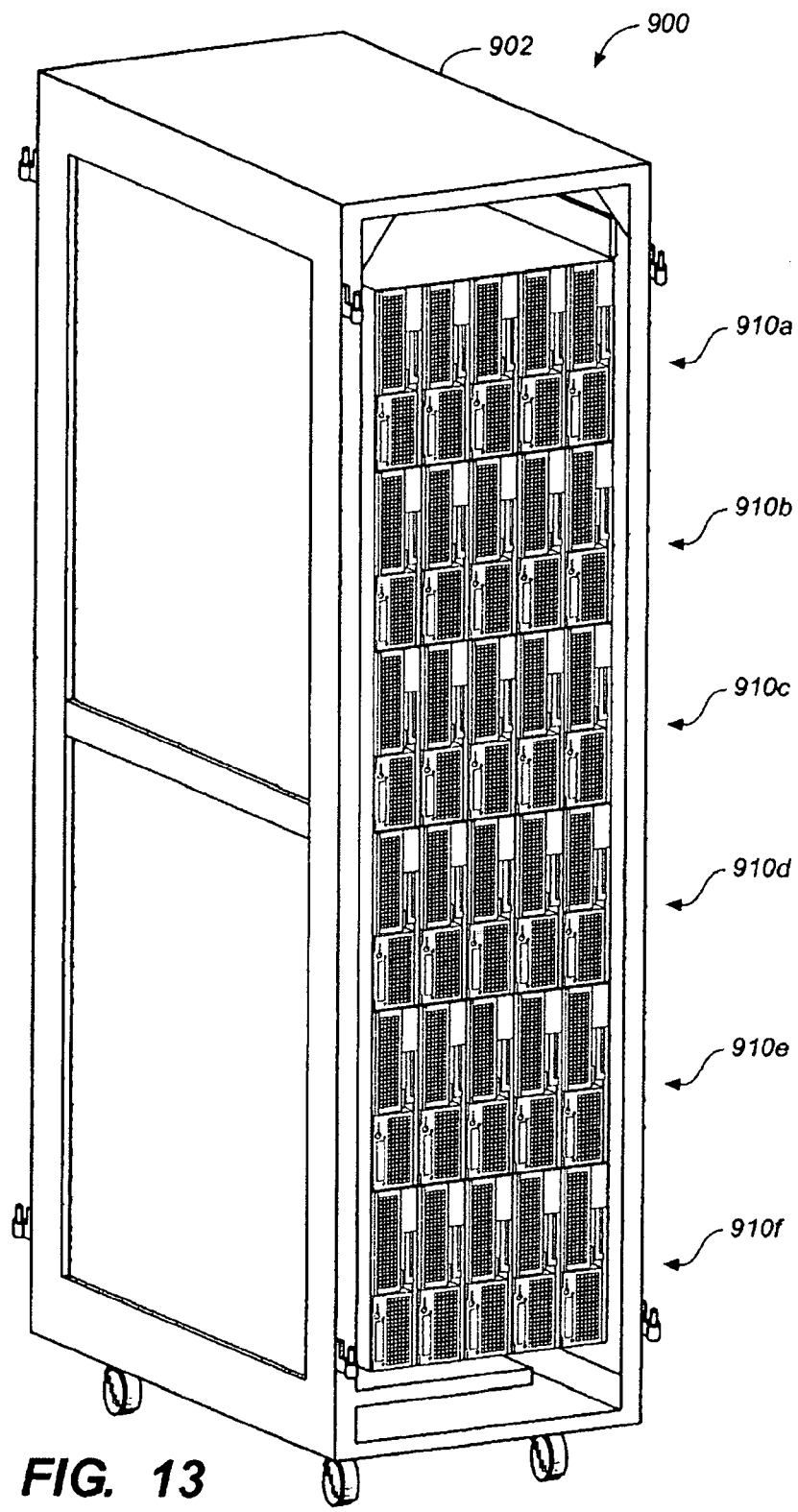
FIG. 13 is a perspective view of rack assembly containing a plurality of cluster modules, in accordance with embodiments of the present invention.

In accordance with other embodiments, a computer 210 having the computer chassis 600 as described above can be mounted into a standard 19" rack. FIG. 13 shows a computer system 900, comprising an EIA standard 19" rack assembly 902 and a plurality of computers 210, in accordance with embodiments of the present invention. The rack assembly 902 may have, e.g., an interior measuring approximately 19" wide, approximately 40" deep, and approximately 77" tall. In this embodiment, the rack assembly 902 contains a plurality of cluster modules 910a-910f, each cluster module 910 containing a plurality of computers 210. These computers 210 are oriented vertically, in contrast with the horizontal mounting of computers 210 shown in FIG. 2A.

Figure 14A:
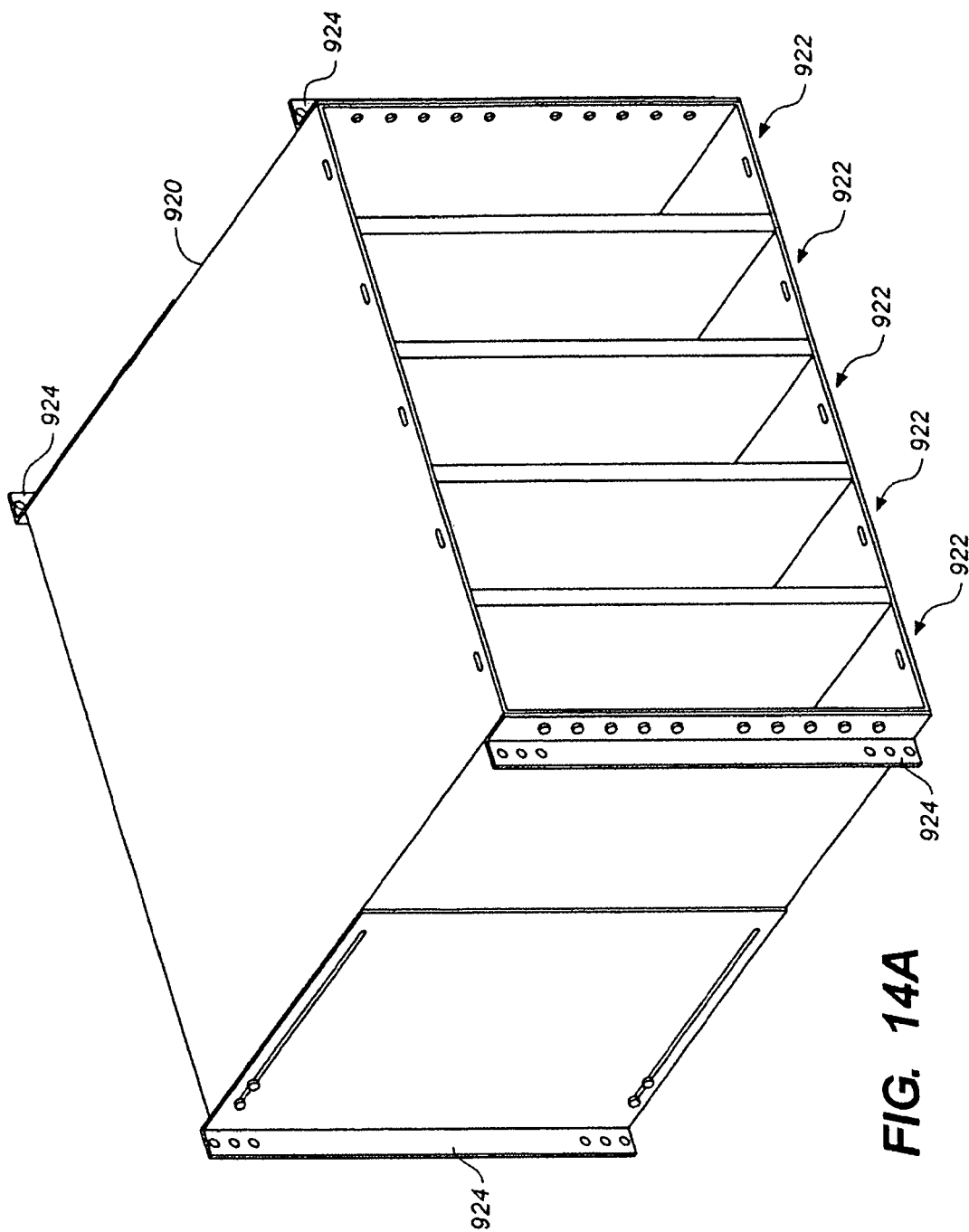
FIGS. 14A-14D are perspective views of a cluster module, in accordance with embodiments of the present invention.

FIG. 14A shows a perspective view of an empty cluster module chassis 920. The cluster module chassis 920 comprises a plurality of computer bays 922 and a plurality of rack-mountable flanges 924. The cluster module chassis 920 can be mounted in the rack assembly 902, for example, by attaching the flanges 924 to vertical supports in the rack assembly 902 using thumbscrews. Each cluster module chassis 920 may, for example, be formed of sheet metal and be 12.25" tall, 17.5" wide, and 18.5" deep. Accordingly, the cluster module 910 containing a plurality of computers 210 may be mounted in a standard 19" rack.

Figure 14B:
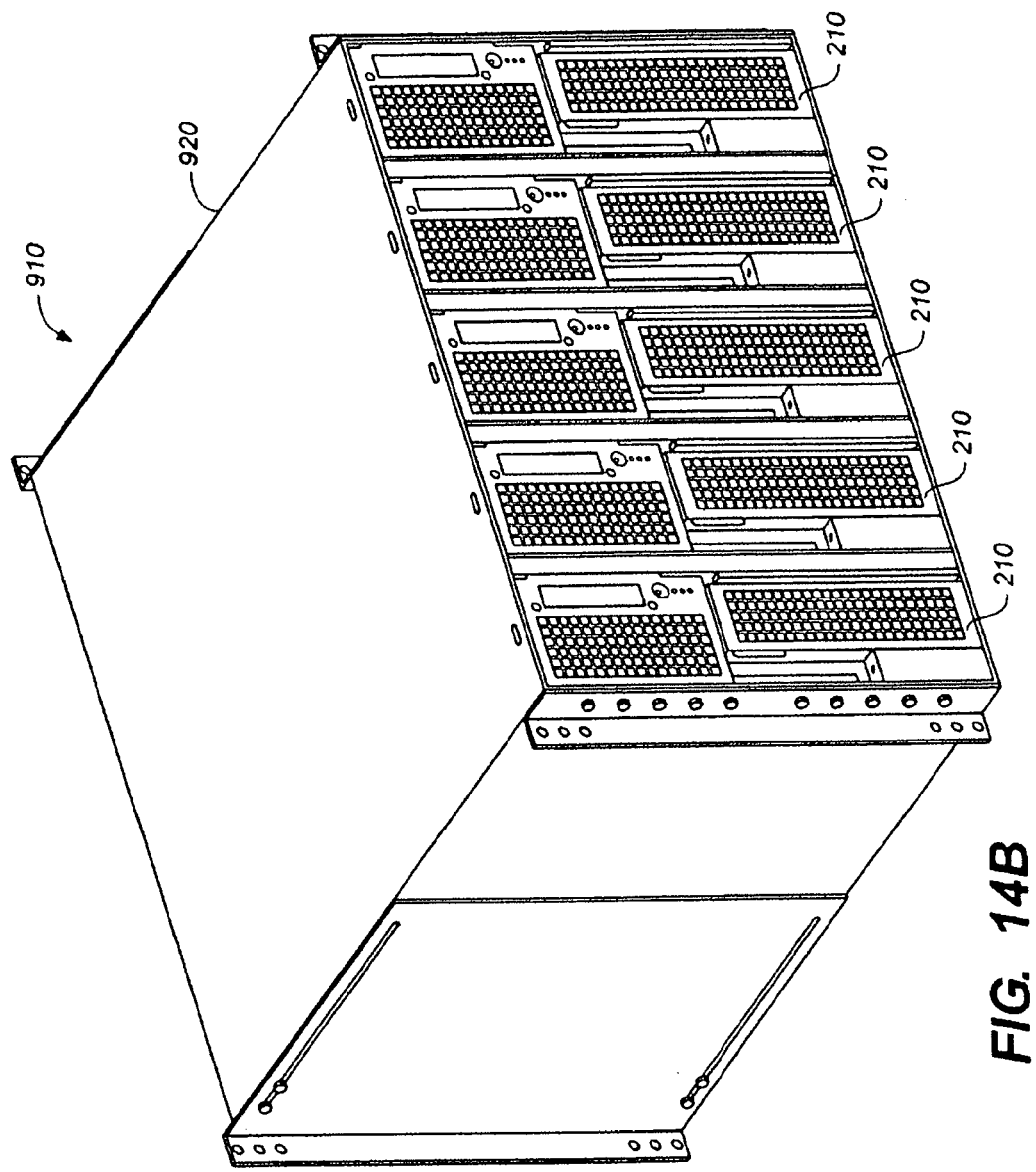
Figure 14C:
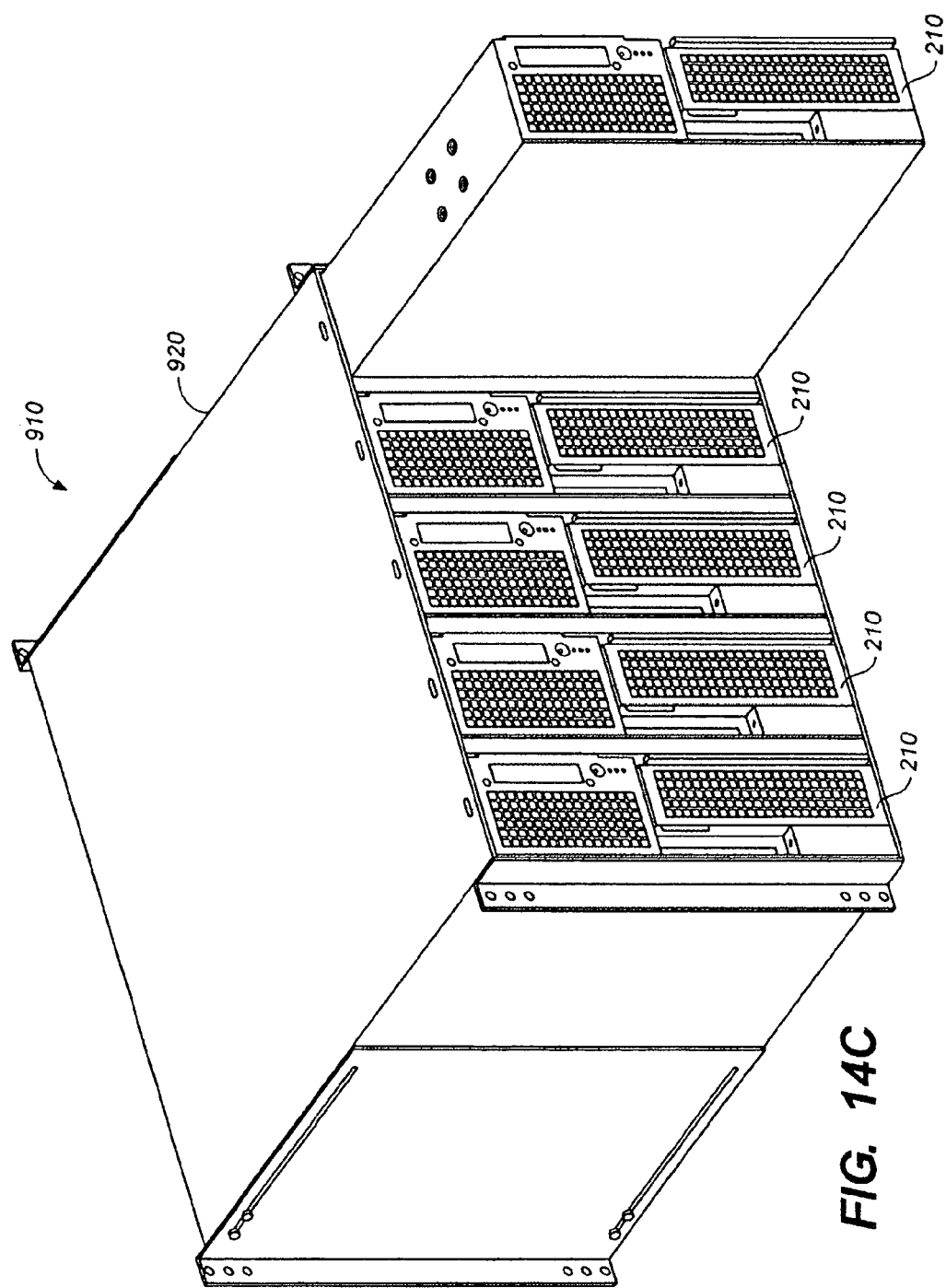
Figure 14D:
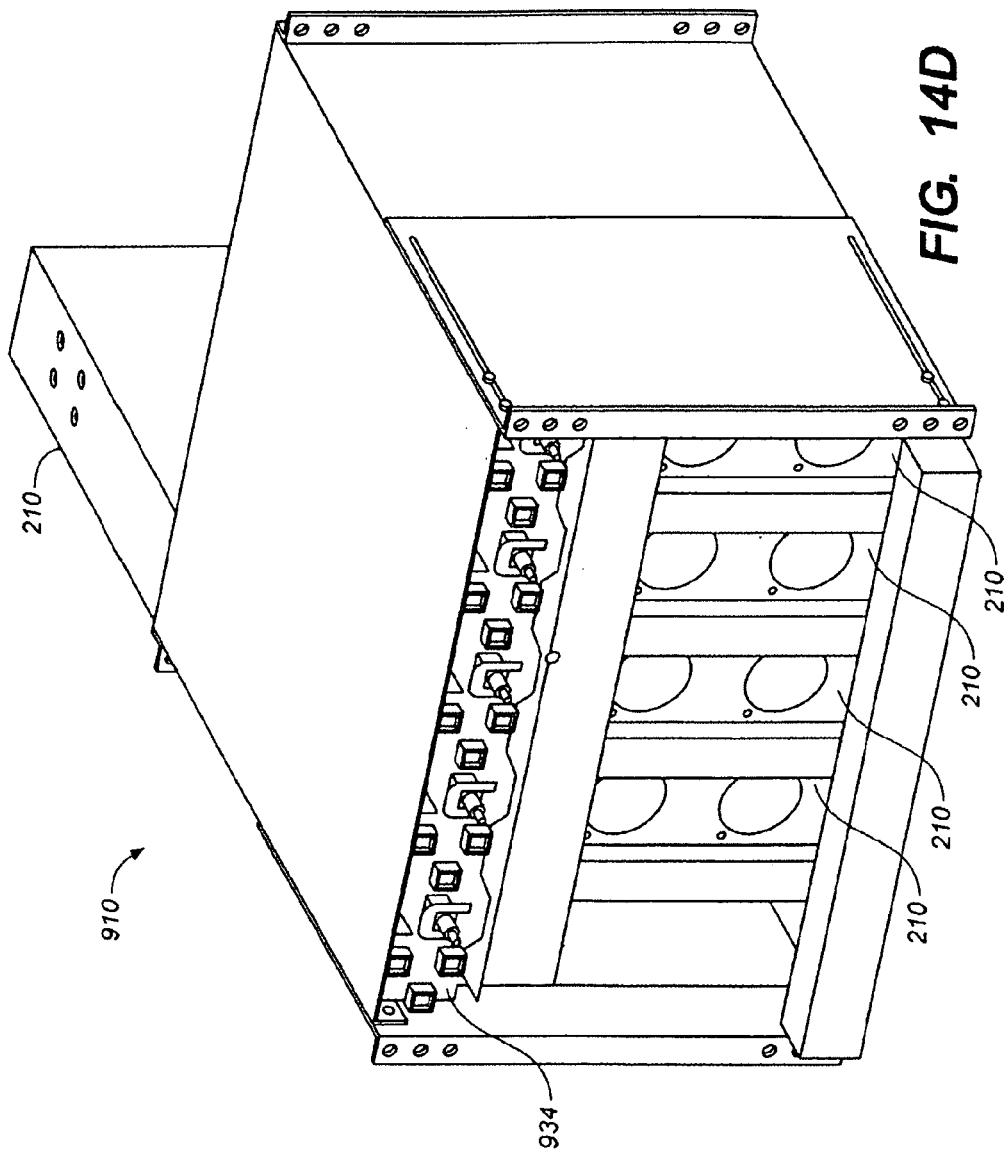

FIGS. 14B-14C are perspective views of a cluster module chassis 920 filled with computers 210. In FIG. 14C, one computer 210 is shown partially removed. FIG. 14D shows a perspective rear view of the cluster module 910. In this view, it can be seen that the cluster module chassis 920 may comprise a rear support 934, similar to the rear support 234 described above and in greater detail in U.S. provisional patent application No. 60/568,969 entitled "INTERFACE ASSEMBLY," filed May 7, 2004, the disclosure of which is incorporated herein in its entirety.

In the computer system 900, shown in FIG. 13, the rack assembly 902 is filled with cluster modules 910a-910f. In other embodiments, one or more cluster modules 910 may be mounted in the rack assembly 902 adjacent to computers having conventional form factors, such as, e.g., 19" wide 1U servers. In this way, the computers 210 can be utilized in a mixed-computer environment without requiring installation of dedicated rack assemblies 201.

Figure 15:
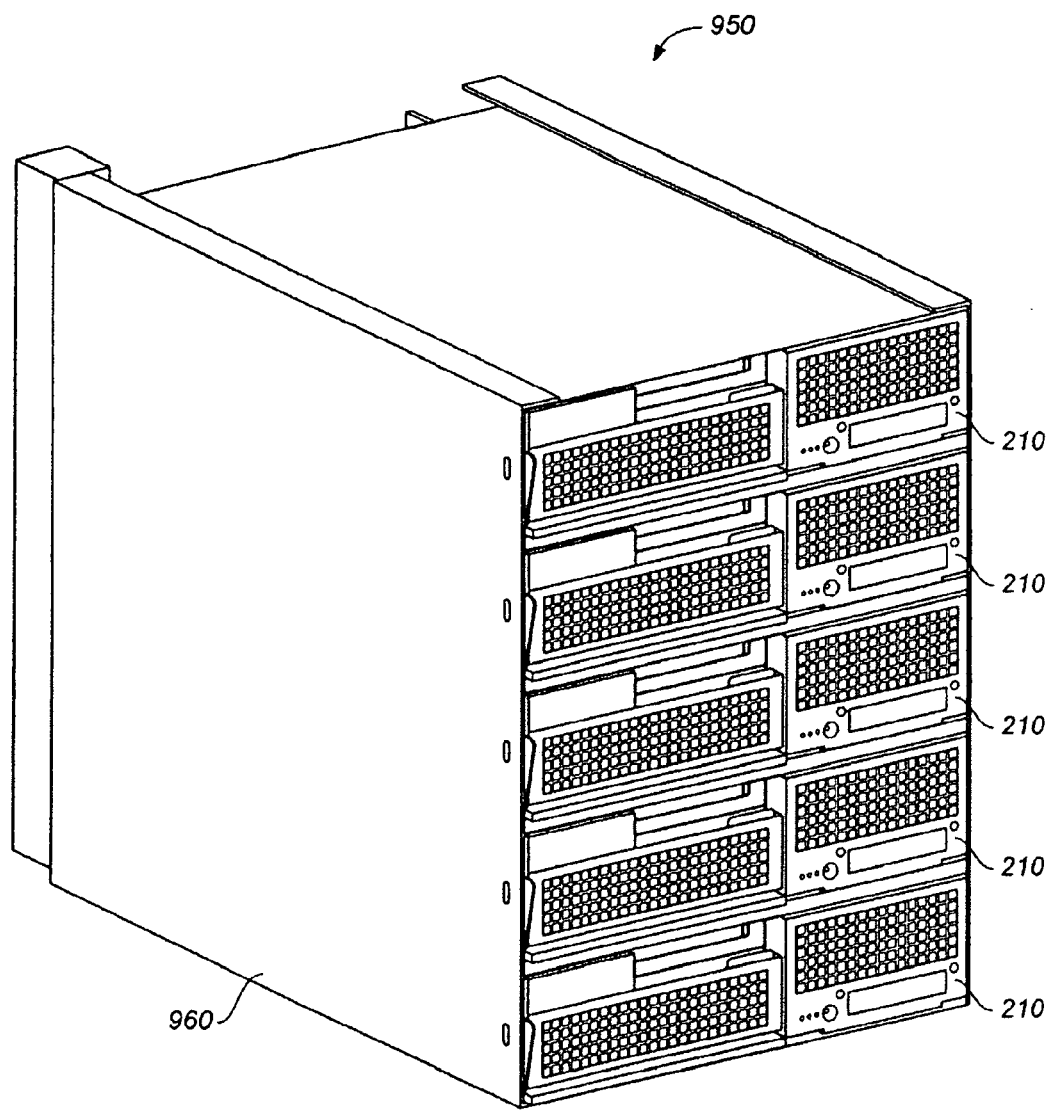
FIG. 15 is a perspective front view of a cluster module in a vertical orientation, in accordance with embodiments of the present invention.

In accordance with other embodiments of the present invention, the cluster module 910 may be mounted in a rack in a vertically-oriented configuration 910', as shown in FIG. 15. This cluster module 910' may be substantially similar or identical to the cluster module 910 shown in FIGS. 14A-14D, but is configured to mounted in a rack in a vertical orientation, such that the computers 210 contained therein are horizontally-oriented when deployed. The cluster module 910' may comprise a cluster module chassis 920', similar to cluster module chassis 920, but with the flanges 924 for attachment with the rack assembly removed. This cluster module 950 may be installed in a rack assembly similar to rack assembly 201, but without the support flanges 250 for each individual computer 210. Thus, the same cluster module 910 can be deployed in both horizontal and vertical orientations, enabling the cluster module 910 to be used in a wide variety of rack assembly configurations.

While the invention has been described in terms of particular embodiments and illustrative figures, those of ordinary skill in the art will recognize that the invention is not limited to the embodiments or figures described. For example, many of the embodiments described above refer to the computer systems being utilized as part of a server farm. In other embodiments, the computer systems may be used for other purposes, such as, for example, storage arrays.

The figures provided are merely representational and may not be drawn to scale. Certain proportions thereof may be exaggerated, while others may be minimized. The figures are intended to illustrate various implementations of the invention that can be understood and appropriately carried out by those of ordinary skill in the art.

Therefore, it should be understood that the invention can be practiced with modification and alteration within the spirit and scope of the appended claims. The description is not intended to be exhaustive or to limit the invention to the precise form disclosed. It should be understood that the invention can be practiced with modification and alteration and that the invention be limited only by the claims and the equivalents thereof.

What is claimed is:

1. A computer chassis, comprising:
    a first chassis retainer on one side of the computer chassis and defining an opening, the first chassis retainer including a first flexible flange biased away from the opening, wherein the first flexible flange includes a protruding portion that extends toward the opening;
    wherein the protruding portion is configured to flex inwardly in relation to the computer chassis; and
    wherein the first flexible flange is configured to be urged outwardly in relation to the computer chassis such that the protruding portion extends through the opening.

2. The computer chassis of claim 1, further comprising a door that, when closed, urges the first flexible flange outwardly in relation to the computer chassis such that the protruding portion extends through the opening.

3. The computer chassis of claim 2, wherein the door includes a lip that urges the first flexible flange outwardly in relation to the computer chassis when the door is closed.

4. The computer chassis of claim 1, wherein to allow the computer chassis to be inserted into a computer bay including a computer retaining recess, the protruding portion flexes inwardly in relation to the computer chassis to allow the computer chassis to be mated in the computer bay.

5. The computer chassis of claim 4, wherein to allow the computer chassis to be mated in the computer bay, the protruding portion springs outwardly in relation to the computer chassis to mate with the computer retaining recess.

6. The computer chassis of claim 4, further comprising a door that, when closed, urges the first flexible flange outwardly in relation to the computer chassis such that the protruding portion extends through the opening, wherein the door remains closed as the computer chassis is inserted into the computer bay.

7. The computer chassis of claim 1, further comprising a door that, when opened, allows the first flexible flange to flex inwardly in relation to the computer chassis to allow the computer chassis to be withdrawn from a computer bay.

8. The computer chassis of claim 1, further comprising a second chassis retainer on a second side of the computer chassis opposite to the first side, the second chassis retainer including a second flexible flange biased outwardly in relation to the computer chassis.

9. The computer chassis of claim 8, wherein the second chassis retainer further comprises a release member that depresses to allow the computer chassis to be withdrawn from a computer bay.

* * * * *